United States Patent
Sugahara

(10) Patent No.: US 7,417,358 B2
(45) Date of Patent: Aug. 26, 2008

(54) ACTUATOR, AND TRANSPORTING APPARATUS, MOVABLE APPARATUS AND DEVICE PROVIDED WITH THE ACTUATOR

(75) Inventor: Hiroto Sugahara, Ama-gun (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 304 days.

(21) Appl. No.: 11/235,313

(22) Filed: Sep. 27, 2005

(65) Prior Publication Data
US 2006/0066177 A1   Mar. 30, 2006

(30) Foreign Application Priority Data
Sep. 27, 2004   (JP) .............. 2004-278911

(51) Int. Cl.
    H01L 41/04  (2006.01)
    H01L 41/08  (2006.01)
(52) U.S. Cl. ..................................... 310/328
(58) Field of Classification Search .............. 310/328
    See application file for complete search history.

(56) References Cited

U.S. PATENT DOCUMENTS

| | | | | |
|---|---|---|---|---|
| 4,613,782 | A | * | 9/1986 | Mori et al. ............ 310/323.16 |
| 5,132,582 | A | * | 7/1992 | Hayashi et al. ........ 310/323.16 |
| 5,700,305 | A | * | 12/1997 | Lowe et al. .............. 65/60.1 |
| 6,157,115 | A | * | 12/2000 | Hassler, Jr. ................ 310/328 |
| 6,211,603 | B1 | * | 4/2001 | Iino et al. ............. 310/323.02 |
| 6,232,700 | B1 | * | 5/2001 | Kosaka et al. .......... 310/323.17 |
| 6,967,430 | B2 | * | 11/2005 | Johansson .................... 310/328 |
| 7,148,605 | B2 | * | 12/2006 | Biegelsen et al. ...... 310/323.16 |

FOREIGN PATENT DOCUMENTS

| | | |
|---|---|---|
| DE | 196 36 827 | 4/1998 |
| DE | 197 55 490 | 6/1999 |
| EP | 1 104 034 | 5/2001 |
| JP | 2003-111456 | 4/2003 |

OTHER PUBLICATIONS

European Search Report based on European Patent Application No. 05021054.1.

* cited by examiner

*Primary Examiner*—Jaydi A San Martin
(74) *Attorney, Agent, or Firm*—Banner & Witcoff, Ltd

(57) ABSTRACT

An actuator includes an apex section which can make a contact with a paper, a thin plate which has two inclined sections each extending from the apex section, a piezoelectric layer which is arranged on each of the inclined sections, and an individual electrode which is provided to each of the piezoelectric layers. The piezoelectric layer between the individual electrode and the inclined section is deformed by being applied with a voltage selectively to the two individual electrodes by a driving circuit. By deforming the piezoelectric layer, the apex section can be displaced and thus the paper can be transported. A movable apparatus which is supported on the floor by the apex section is also provided. A micro device in which an element is provided to the apex section is also provided.

28 Claims, 23 Drawing Sheets

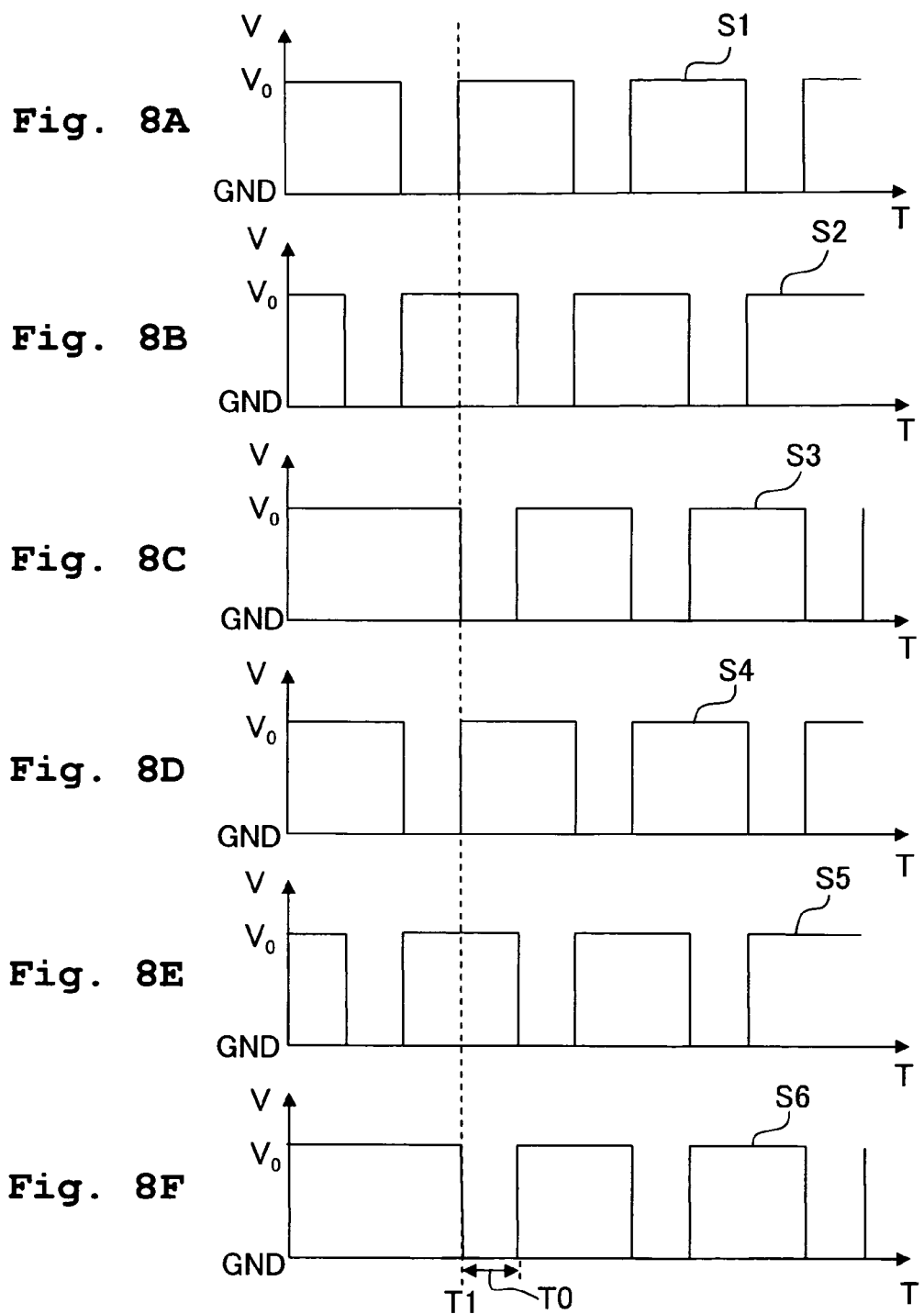

ACTUATOR, AND TRANSPORTING APPARATUS, MOVABLE APPARATUS AND DEVICE PROVIDED WITH THE ACTUATOR

BACKGROUND OF THE INVENTION

1. Field of the Invention

The present invention relates to an actuator which is displaceable by a very small amount by using a piezoelectric element; and a transporting apparatus, a movable apparatus, and a device which include the actuator.

2. Description of the Related Art

A transporting apparatus which includes a transporting roller and a drive motor which drives the transporting roller has been hitherto used for transporting a paper to be recorded in a recording apparatus. However, in recent years, a technology for applying a piezoelectric actuator, having a piezoelectric element made of a ceramics material such as lead zirconate titanate (PZT), to a variety of usages has been studied, and in particular, a technology for transporting an object to be transported by using a deformation which is developed when a voltage is applied to the piezoelectric element has been proposed. For example, a piezoelectric actuator which has a plurality of piezoelectric elements each including a substrate in the form of a plate, piezoelectric elements provided to both surfaces of the substrate, and a plurality of electrodes formed on surfaces of the piezoelectric elements, is described in Japanese Patent Application Laid-open Publication No. 2003-111456. This piezoelectric actuator is structured such that a front tip portion of the substrate is caused to be deformed due to bending deformation of the piezoelectric element, and an object to be transported is transported by being moved by a very small amount in a longitudinal direction of the object by a ciliary movement of a plurality of substrates arranged in a circumferential direction of the object to be transported which is cylindrical or tubular in shape.

SUMMARY OF THE INVENTION

A conventional transporting apparatus for transporting an object to be transported such as a paper, by a transporting roller, requires a drive motor for rotating the transporting roller and a plurality of gears for transmitting a driving force of the drive motor to the transporting roller, which involves a problem that the size of the transporting apparatus is increased. Moreover, in recent years, to realize an improvement in quality of an image to be recorded on a paper, there is a demand for a technology to transport the object to be transported such as paper by a minute feeding quantity (about several tens of μm, for example). However, in the conventional apparatus which transports the object by using the transporting roller, there has been a limit on reducing the feeding amount.

On the other hand, in the piezoelectric actuator in the Japanese Patent Application Laid-open Publication No. 2003-111456, it is possible to transport the object to be transported by a minute feeding amount by the ciliary movement of a substrate. However, this transporting apparatus is structured to transport an object to be transported which is mainly cylindrical or tubular in shape, and since there is a restriction on the shape of the object to be transported, it is difficult to use this piezoelectric actuator for transporting an object to be transported which has a shape other than the cylindrical or tubular shape, such as a paper. Moreover, since this transporting apparatus transports the object to be transported by allowing only a tip of the substrate to be in contact with the object to be transported by using the ciliary movement, it is not suitable for transporting objects which are comparatively heavier.

A first object of the present invention is to provide a new actuator in which an operating section is firmly supported, which moves an object by a minute amount, and which acts on the object. A second object of the present invention is to provide a new movable apparatus which includes the actuator according to the present invention. A third object of the present invention is to provide a new device which comprises the actuator and an element according to the present invention. A fourth object of the present invention is to provide a transporting apparatus which can transport objects to be transported of various shapes by a minute feed amount.

According to the present invention, there is provided an actuator (10, 210, 300, 600) comprising: a thin plate (20, 220a) which is bent and which has an apex section (21, 121, 221); two inclined sections (22, 222a) which extend from the apex section; two piezoelectric layers (26) which are arranged on the two inclined sections respectively; and two first electrodes (27, 327) which are provided to the two piezoelectric layers respectively, and a second electrode (22, 382) which is provided to the two piezoelectric layers. In this actuator, the two first electrodes may be two individual electrodes each of which is provided to one surface of one of the two piezoelectric layers; and the second electrode may be a common electrode which is provided to other surfaces of the two piezoelectric layers. Or, the first electrodes and the second electrode may be provided to a same surface of the piezoelectric layers. In the actuator according to the present invention, when a voltage is applied to the first electrodes and the second electrode which are provided to the two inclined sections of the thin plate, for example, to the individual electrodes and the common electrodes which sandwich the piezoelectric layers, the piezoelectric layers are deformed due to a piezoelectric transverse effect. With this deformation, there is developed a deformation by bending in the inclined sections, and the position of the apex section between the two inclined sections is changed. By applying a voltage selectively to the two first electrodes or the individual electrodes, it is possible to displace the apex section by a minute amount in different directions (vertical and horizontal direction). Moreover, it is possible to adjust the amount of displacement according to the voltage. Accordingly, it is possible to move (transport) an object by a controlled amount and velocity while supporting the object at the apex section of the actuator. Moreover, by displacing the apex section of the actuator on the object, the actuator itself can move by the controlled amount and velocity on the object. Furthermore, by mounting a sensor element and/or an optical element such as a lens and/or a mirror on the apex section, the actuator can function as an actuator in which the sensor element and the optical element can be driven freely in X, Z direction and about Y axis. In particular, since the apex section is supported by two inclined sections, even if the element has some weight, it is possible to hold and displace the element stably. It is also possible to support the apex section by four inclined sections and it is possible to support and transport the object placed on the apex section with more stability. Moreover, by supporting the apex section by the four inclined sections, a three dimensional displacement of the apex section becomes possible.

In the actuator according to the present invention, the thin plate (20) is bent in a direction orthogonal to a predetermined plane, the two inclined sections (22) extend from the apex section (21) substantially in parallel to a transporting direction as viewed from the direction orthogonal to the predetermined plane; the apex section (21) of the thin plate is a contact section which makes contact with an object (P); and bases (23) may be provided to edges of the two inclined sections respectively. Furthermore, the actuator may include a substrate (25) to which the thin plate is attached via the bases.

Moreover, according to the present invention, there is provided a transporting apparatus which transports the object (P) in a transporting direction along the predetermined plane, the transporting apparatus comprising: a plurality of the actuators (10) of the present invention; and a voltage applying unit (12) which applies a voltage selectively to the two individual electrodes of each of the actuators.

In this transporting apparatus, the two piezoelectric layers are formed on the two inclined sections of the thin plates respectively. When a voltage is applied by the voltage applying unit to the individual electrodes which are provided on the two piezoelectric layers, the piezoelectric layer which is sandwiched between the common electrode and the individual electrode to which the voltage is applied is deformed due to the piezoelectric transverse effect. With the deformation of the piezoelectric layer, the deformation by bending is developed in the inclined sections. Therefore, there is change in a position of the contact section formed between the two inclined sections. In other words, by applying the voltage selectively to the two individual electrodes by the voltage applying unit, it is possible to displace the contact section which is in contact with the object (object to be transported) by a minute amount in the transporting direction. Therefore, it is possible to transport various objects, having various shapes with which the contact section can make a contact, by a minute feed amount along the predetermined plane (transporting plane). The predetermined plane of the object is not restricted to a flat surface and in a case where the plurality of actuators are arranged along a curved surface, the object can be transported along this curved surface.

In the transporting apparatus in the present invention, the plurality of actuators may be arranged along a same plane. In this case, the object can be transported along a transporting plane which is flat.

In the transporting apparatus in the present invention, the thin plate and the bases (23) may be provided on one plate member. Since the thin plate (21) and the bases (23) are made of a single plate member (24), the number of components is reduced. Moreover, by press processing the single plate member, both of the thin plate and the bases can be formed easily and at low cost.

In the transporting apparatus of the present invention, the plate member may be formed of a conductive material, and the inclined sections (22) may function as the common electrode. Therefore, it is not necessary to provide the common electrode separately from the inclined section.

In the transporting apparatus in the present invention, when a voltage is applied to both of the individual electrodes by the voltage applying unit, the actuator may move to a stand-by position at which the contact section makes no contact with the object; when a voltage is applied only to one of the two individual electrodes by the voltage applying unit, the actuator may move to a transporting-preparation position which is positioned on an upstream side of the stand-by position in the transporting direction and at which the contact section is capable of making a contact with the object; and when a voltage is applied only to the other of the two individual electrodes by the voltage applying unit, the actuator may move to a transporting-end position which is positioned on a downstream side of the stand-by position in the transporting direction and at which the contact section is capable of making a contact with the object. Therefore, by allowing the contact section of the thin plate to make a contact with the object by moving the contact section from the stand-by position to the transporting-preparation position, and further by moving the contact section to the transporting-end position, the object which is in contact with the contact section can be sent in the transporting direction. Furthermore, since it is possible to move the contact section to the transporting-preparation position once again after returning the contact section to the stand-by position from the transporting-end position, the transporting operation of the object can be carried out smoothly without the object and the contact section making a contact while moving the contact section from the transporting-end position to the transporting-preparation position.

The transporting apparatus in the present invention may comprise a supporting member which supports the object from a side of the contact section, wherein the supporting member may support the object at a position which is away from the contact section which is at the stand-by position in a direction of projection of the thin plate, and which is away from the contact section which is at the transporting-preparation position and the contact section which is at the transporting-end position in a direction opposite to the direction of projection. Therefore, while moving the contact section between the stand-by position, the transporting-preparation position, and the transporting-end position, even when the contact section is at the stand-by position where the contact section does not come in contact with the object, the object is always supported by the supporting member from the side of the contact section. Accordingly, it is possible to transport the object stably in the transporting direction.

The transporting apparatus of the present invention may be constructed such that the plurality of actuators may be divided into three types of actuators and the voltage applying unit applies a voltage to the individual electrodes of the three types of actuators such that three contact sections of the three types of actuators are positioned at one of the stand-by position, the transporting-preparation position, and the transporting-end position, and such that the three contact sections are at different positions from one another. The three types of actuators may be arranged in a predetermined order in a direction which is orthogonal to the transporting direction and in parallel to the predetermined plane. Thus, because the contact sections of the three types of actuators are at different positions and these three types of actuators carry out the transporting operation separately, a velocity of transporting becomes higher as compared to a case in which all the actuators carry out the transporting operation with the same cycle. Moreover, even when the contact section of a part of the actuators is at the stand-by position where the contact section does not make a contact with the object, since the object is supported from a lower side by the contact section of the other actuator, the object does not vibrate during the transportation and can be transported smoothly. Furthermore, because these three types of actuators are arranged in the predetermined order in the direction orthogonal to the transporting direction and parallel to the transporting surface, and the same type of actuators are arranged not to concentrate at a particular location, force acts evenly on the object, and the object can be transported smoothly in the predetermined transporting direction.

In the transporting apparatus of the present invention, the plurality of actuators may be arranged at least in two rows in a direction orthogonal to the transporting direction and in parallel to the predetermined plane; and the voltage applying unit may apply voltage to individual electrodes of one of the actuators which is positioned at a downstream side in the transporting direction, by supplying a drive pulse signal having a frequency or a voltage higher than a frequency or a voltage of a drive pulse signal supplied to individual electrodes of another actuator which is positioned at an upstream side in the transporting direction. As the voltage of the drive pulse signal supplied to the actuator is higher, an amount of deformation of the piezoelectric layer becomes greater. Therefore, an amount of displacement of the contact section while moving from the transporting-preparation position to the transporting-end position becomes greater. Also, as the frequency of the drive pulse signal supplied to the actuator is higher, a velocity of movement of the contact section between the stand-by position, the transporting-preparation position, and the transporting-end position becomes greater. In other words, as the frequency or the voltage of the drive pulse signal supplied to the actuator is higher, the transporting velocity of the actuator becomes greater. Further, because the drive-pulse signal, having a frequency or a voltage higher than a frequency or a voltage of the drive pulse signal supplied to the individual electrodes of the actuator which is positioned at the upstream side in the transporting direction, is supplied to the individual electrodes of the actuator which is positioned at the downstream side in the transporting direction, the transporting velocity of the actuator at the downstream side of the transporting direction is higher than the transporting velocity of the actuator at the upstream side of the transporting direction. A pulling force in the transporting direction acts on the object due to a difference in the transporting velocities. Therefore, the object can be stretched in the transporting direction, thereby preventing the bending of the object.

In the transporting apparatus of the present invention, at least a part of the inclined sections of the plurality of actuators may be inclined at a predetermined angle with respect to the transporting direction, towards an outer side in a width direction which is orthogonal to the transporting direction, as viewed from the direction orthogonal to the predetermined plane. Therefore, when the object is transported in the transporting direction, the pulling force acts on the object in the width direction which is orthogonal to the transporting direction. Therefore, it is possible to transport the object while stretching the object in the width direction.

In the transporting apparatus of the present invention, the plurality of actuators may be arranged in the direction orthogonal to the transporting direction and in parallel to the predetermined plane; and the voltage applying unit may apply voltage to individual electrodes of a part of the actuators which are included in the plurality of actuators and are positioned on one side of the orthogonal direction, by supplying a drive pulse signal having a frequency or a voltage higher than a frequency or a voltage of a drive pulse signal supplied to individual electrodes of actuators positioned on the other side of the orthogonal direction. A transporting velocity of the actuator which is positioned on one side in the orthogonal direction and to which the drive pulse signal having the higher frequency or higher voltage is applied, is higher than a transporting velocity of the actuator which is positioned on the other side of the orthogonal direction. Therefore, even when the object is inclined with respect to the transporting direction, it is possible to rotate the object while transporting the object and to make the object parallel to the transporting direction due to a difference between the transporting velocities of the actuators.

In the transporting apparatus of the present invention, the two inclined sections of the thin plate may be curved inwardly when no voltage is applied to the two individual electrodes by the voltage applying unit. Thus, when the inclined sections are curved inwardly, the inclined sections tend to bend further, thereby improving a driving efficiency of the actuator.

The transporting apparatus of the present invention may be structured such that two groups of the plurality of actuators are arranged along two mutually parallel planes, and the object is pinched between these two groups of actuators and transported in the transporting direction. Therefore, it is possible to pinch the object between the two groups of actuators and to transport the object assuredly in the transporting direction.

The transporting apparatus of the present invention may have a guide member which is arranged to face the plurality of actuators; and the guide member may have guide sections each of which faces one of the contact sections of the plurality of actuators and each of which projects towards one of the contact sections to guide the object. Therefore, it is possible to pinch the object to be transported by the projecting guide sections and the contact sections of the thin plates and to transport the object stably in the transporting direction.

In the transporting apparatus of the present invention, the contact section of the thin plate may be roughened. In this case, the friction acting between the object and the contact section increases and the object hardly slips on the contact section. Therefore, the object can be transported assuredly in the transporting direction.

In the transporting apparatus of the present invention, low stiffness sections may be formed in an edge of each of the inclined sections on a side of the contact section and in an edge of each of the inclined sections on a side of the base, the low stiffness sections having a stiffness lower than a stiffness of a portion other than the edge of each of the inclined sections on the side of the contact section and the edge of each of the inclined sections on a side of the base. Thus, since the low stiffness sections are provided at the edges of the inclined sections which are link sections between the contact section and the base, the thin plate tends to deform easily and the contact section can be displaced even with a low voltage. Therefore, the driving efficiency of the actuator is improved.

According to the present invention, there is also provided a paper transporting apparatus of an image information equipment which transports a paper by the plurality of actuators of the present invention along a predetermined transporting plane. By applying the voltage selectively to the two individual electrodes by the voltage applying unit, it is possible to change minutely the position of the contact section in the transporting direction. Therefore, it is possible to transport a paper used in the image information equipment such as a printer, a facsimile machine, and a scanner by a minute feed amount along the predetermined transporting plane. Therefore, it is possible to record and read a high quality image.

According to the present invention, there is provided a movable apparatus which moves with respect to an object and comprises a plurality of the actuators (10) of the present invention, a substrate (25) which supports the thin plate of each of the actuators, a voltage applying unit (12) which applies a voltage selectively to the two individual electrodes of each of the actuators, wherein the apex section moves with respect to the object. This movable apparatus can move on the object by a controlled amount by applying voltages in different phases to at least two of the actuators by the aid of the voltage applying unit so that behaviors of the at lest two actuators are different from each other. It is also possible to mount a sensor or a camera on the substrate. Therefore, this movable apparatus is useful for an application such as transporting and testing of a material in minute holes and gaps.

According to the present invention, there is provided a device (200) including an actuator, the device comprising: the actuator (210) of the present invention; an element provided to the apex section (221) of the actuator or to at least one of the inclined sections (22); and a voltage applying unit which applies voltage selectively to the two individual electrodes of the actuator. This device can drive an element such as a sensor and an optical element by a controlled minute amount. Therefore, this device is useful for applications such as diagnosis and testing or as a device to be incorporated in a micro device.

BRIEF DESCRIPTION OF THE DRAWINGS

FIG. 2 is a diagram showing main components of a paper transporting apparatus.

FIG. 3 is a diagram showing a piezoelectric actuator.

FIG. 8 (FIGS. 8A to 8F) is a waveform diagram of drive pulse signals S1 to S6 supplied to individual electrodes of three types of actuators;

FIG. 9 is a diagram showing a transporting operation by the three types of actuators, where

FIG. 23 is a diagram showing a piezoelectric actuator of an eleventh modified embodiment, where

FIG. 26 is a diagram showing a piezoelectric actuator of a fourth embodiment, wherein

DETAILED DESCRIPTION OF THE PREFERRED EMBODIMENTS

First Embodiment

Figure 1:
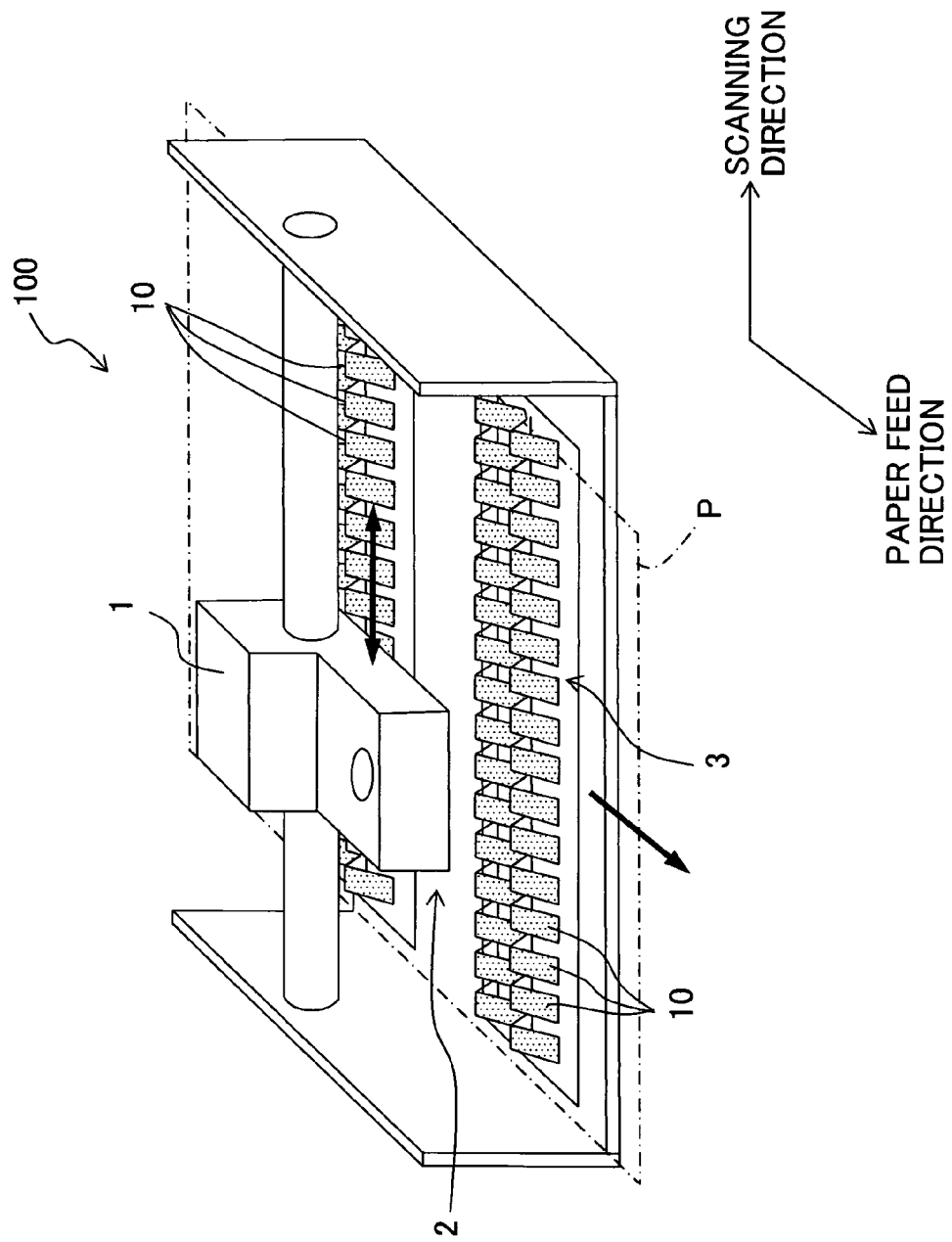
FIG. 1 is a schematic perspective view of an ink-jet printer according to an embodiment of the present invention.

Embodiments of the present invention will be described below. A first embodiment is an example in which the present invention is applied to a paper transporting apparatus of an ink-jet printer. To start with, the ink-jet printer will be described briefly. As shown in FIG. 1, an ink-jet printer 100 includes a carriage 1 which can be moved in a horizontal direction in FIG. 1, a serial ink-jet head 2 which is provided to the carriage 1, and discharges ink onto a recording paper P, a paper transporting apparatus 3 which transports the recording paper P in a forward direction in FIG. 1 as indicated by an arrow, and a control unit 4 (see FIG. 7) which controls the entire ink-jet printer 100. The ink-jet head 2 moves integrally with the carriage 1 in the horizontal direction (scanning direction), and discharges ink onto the paper P, which is transported in the forward direction by the paper transporting apparatus 3, from an ejection port of a nozzle which is formed in an ink-discharge surface formed on the under surface of the carriage 1.

Figure 2A:
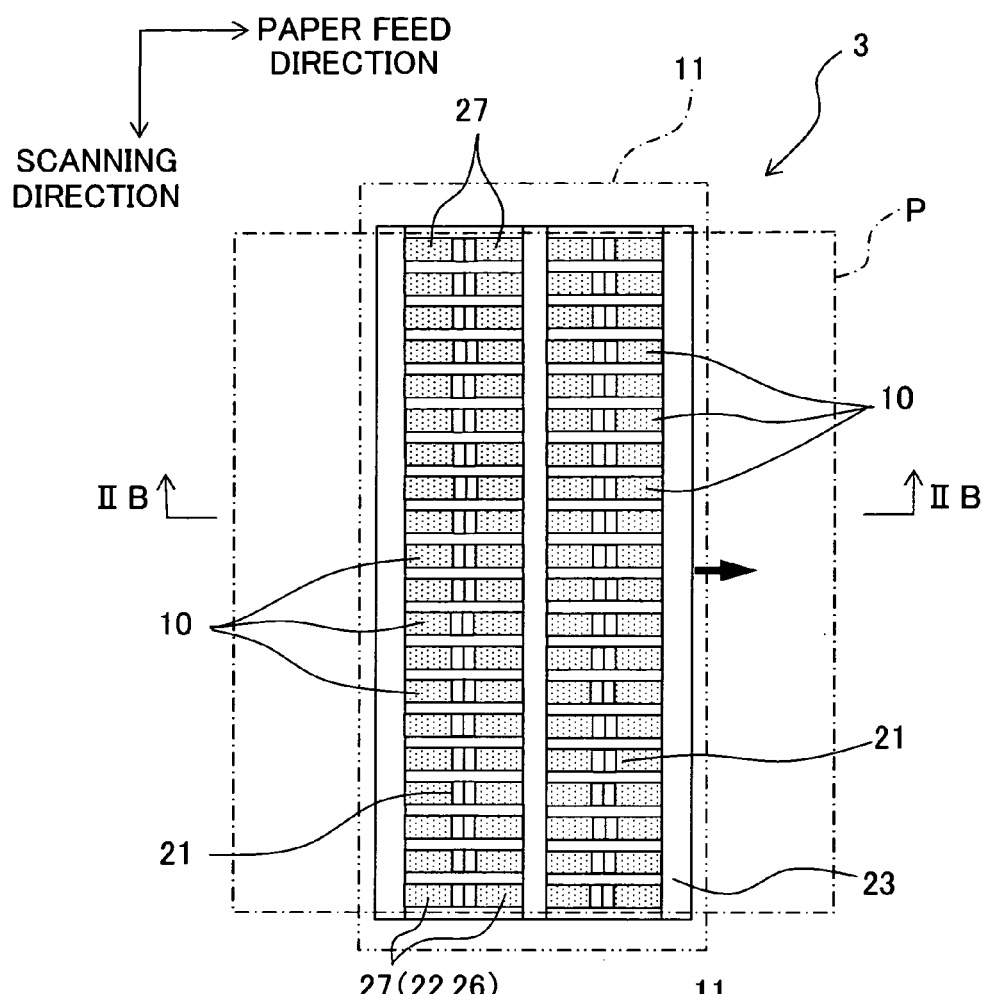
FIG. 2A is a plan view and FIG. 2B is a cross-sectional view taken along a line IIB-IIB in FIG. 2A.
Figure 2B:
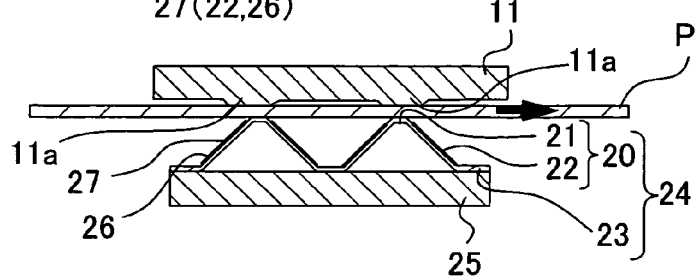

Next, the paper transporting apparatus 3 will be explained. As shown in FIG. 1 and FIG. 2, the paper transporting apparatus 3 includes a plurality of actuators 10 arranged in the scanning direction (horizontal direction in FIG. 1) along the horizontal plane, a guide member 11 which is arranged above the plurality of actuators and facing the actuators horizontally, and a driving circuit 12 (see FIG. 7) which supplies a drive signal to the plurality of actuators 10.

Figure 3A:
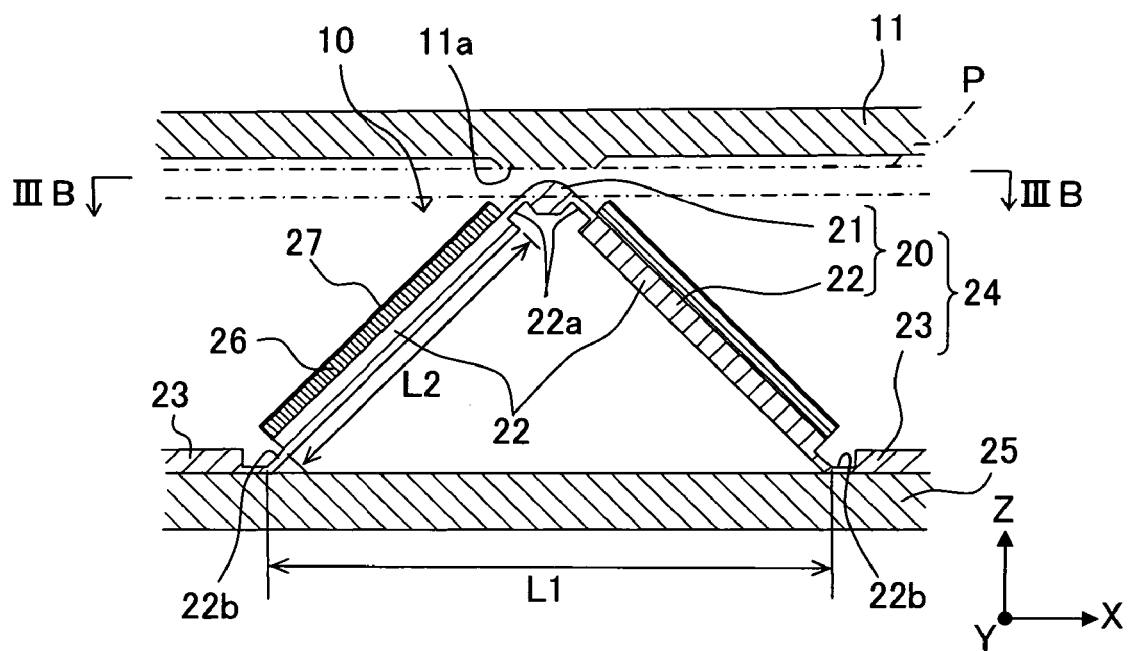
FIG. 3A is a cross-sectional view.
Figure 3B:
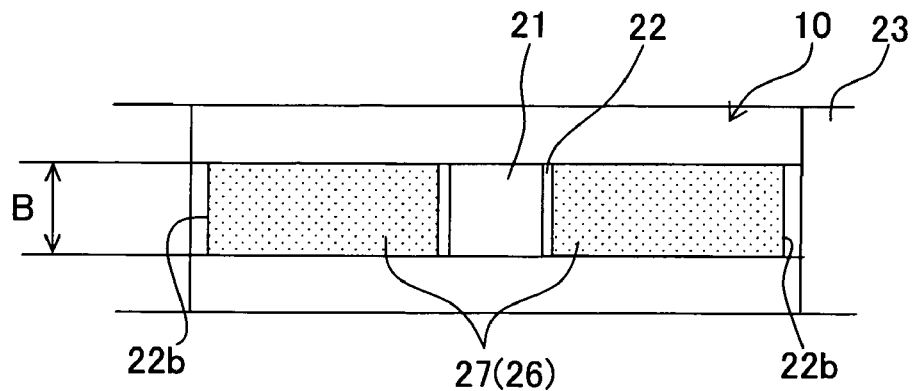
FIG. 3B is a view taken along a line IIIB-IIIB in FIG. 3A.

The plurality of actuators 10 is arranged in two rows, one of the rows being on an upstream side (toward the front in FIG. 1) and the other of the rows being on a downstream side (toward the rear in FIG. 1) of the ink-jet head 2, in the transporting direction. As shown in FIG. 2 and FIG. 3, each actuator 10 has a bent thin plate 20 projecting upwardly (in a direction orthogonal to the horizontal paper transporting plane). Moreover, the bent thin plate 20 includes a contact section 21 disposed in an upper edge which can make a contact with the paper P from a lower side, and two inclined sections 22 each extending from the contact section 21 in a direction parallel to the transporting direction (horizontal direction in FIG. 2A) in a plan view. Moreover, from the two inclined sections 22, two base sections 23 (bases) extend towards a left and right direction horizontally, and the two base sections 23 are fixed to a substrate 25. In other words, the bent thin plate 20 is bent at a central portion in the longitudinal direction and a bent portion has a roof shape which is an apex section (contact section 21). The two inclined sections (22) corresponding to the roof, respectively extend from the apex section (contact section 21) and are positioned on the substrate 25, inclined at a predetermined angle with a surface of the substrate 25. In the first embodiment, the bent thin plate 20 and the two base sections 23 are formed of one plate member 24 made of a metal (such as stainless steel). Therefore, the number of components of the actuator 10 is reduced. Moreover, it is possible to form the bent thin plate 20 and the two base sections 23 by press processing the metallic plate member 24, and the bent thin plate 20 and the base sections 23 can be provided easily and at low cost.

The contact section 21 is formed to have somewhat round shape and an upper surface of the contact section 21 is roughened by a sand blast or a micro blast. Two piezoelectric layers 26 having lead zirconate titanate (PZT) as a main component, which is a solid solution of lead titanate and lead zirconate and a ferroelectric substance, are formed on upper surface portions of the two inclined sections 22. These piezoelectric layers 26 can be formed by depositing particles of PZT on outer surfaces of the inclined sections 22. The piezoelectric layers 26 can be formed by an aerosol deposition method (AD method) in which ultra fine particles are collided to a thin film surface at a high velocity to deposit the layer. In addition, the piezoelectric layers 26 can also be formed by methods such as sputtering method and CVD (chemical vapor deposition) method.

An individual electrode 27 is formed on an entire upper surface (surface on a side opposite to the inclined section 22) of each of the two piezoelectric layers 26. These two individual electrodes 27 are connected electrically to the driving circuit 12 (see FIG. 7) which will be described later, and a drive voltage is applied to the individual electrodes 27 by the driving circuit 12. On the other hand, the metallic inclined sections 22 positioned at a lower side of the piezoelectric layers 26 are always maintained at ground potential via the base sections 23. In other words, since the inclined sections 22 also serves as a common electrode which generates an electric field in the piezoelectric layer 26 sandwiched between the inclined section 22 and the individual electrode 27 when the drive voltage is applied to the individual electrode 27 by the driving circuit 12, there is no need to provide the common electrode separately.

When the drive voltage is applied to the individual electrode 27 by the driving circuit 12, there is a difference in electric potential between the individual electrode 27 and the inclined section 22 which serves as the common electrode and is maintained at the ground potential, and an electric field is generated in the piezoelectric layer 26 in a direction of thickness thereof, the piezoelectric layer 26 being sandwiched between the individual electrode 27 and the inclined section 22. As the electric field is generated, the piezoelectric layer 26 contracts in a direction orthogonal to the direction of thickness. With the contraction of the piezoelectric layer 26, the inclined section 22 is deformed so as to project inwardly.

Figure 4:
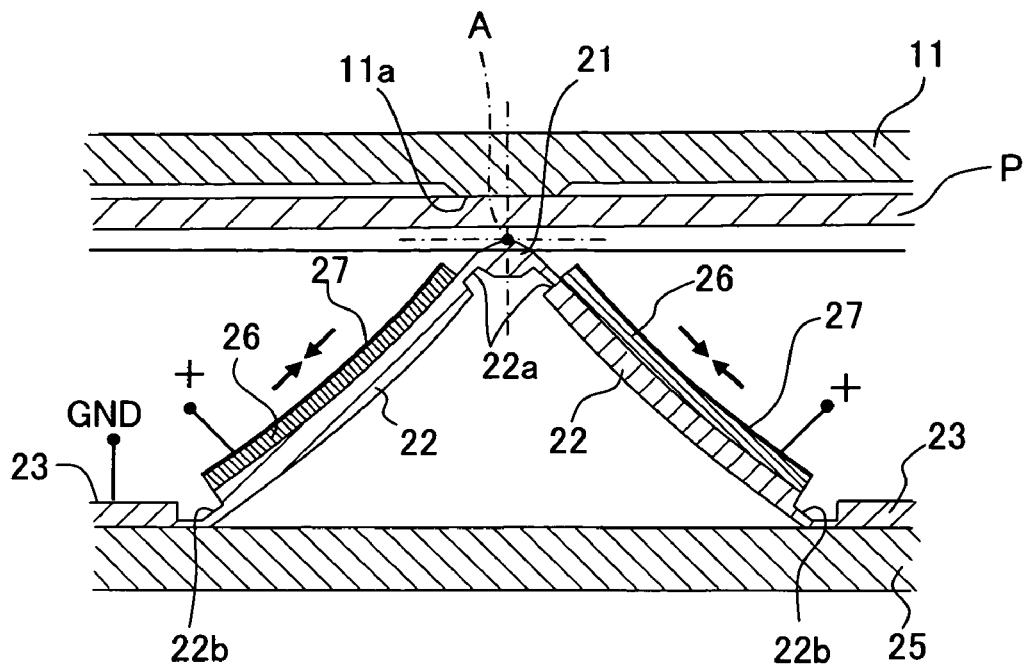
FIG. 4 is a cross-sectional view of the piezoelectric actuator when a contact section is at a stand-by position.
Figure 5:
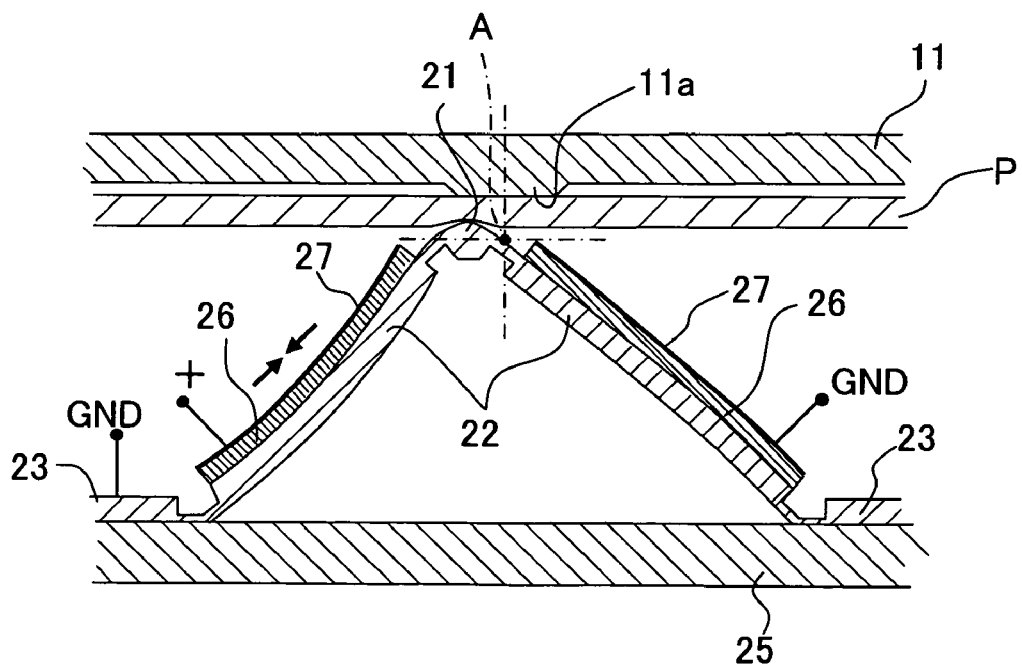
FIG. 5 is a cross-sectional view of the piezoelectric actuator when the contact section is at a transporting-preparation position.
Figure 6:
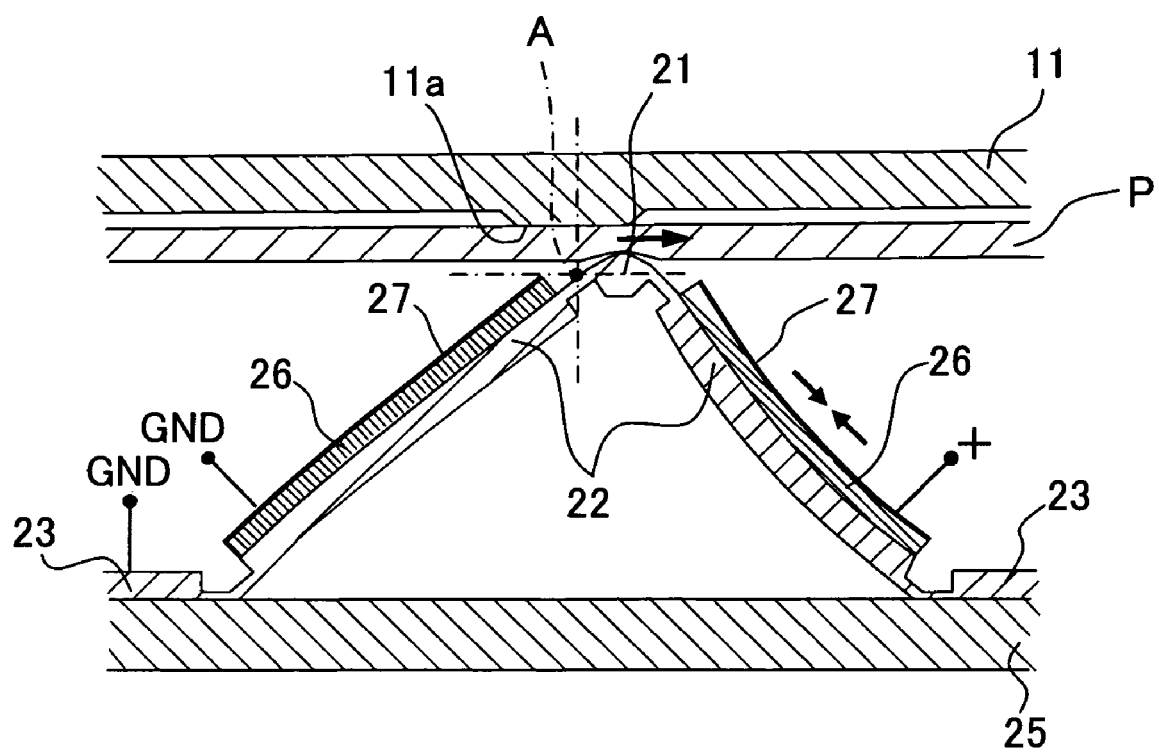
FIG. 6 is a cross-sectional view of the piezoelectric actuator when the contact section is at a transporting-end position.

Therefore, as shown in FIG. 4 to FIG. 6, by applying the drive voltage first on both of the individual electrodes 27, then on one of the individual electrodes 27, and then on the other individual electrode 27 by the driving circuit 12, the contact section 21 can be moved by a minute amount (about several tens of μm, for example) in the transporting direction (towards right side in FIG. 4 to FIG. 6) by deforming the inclined section or sections 22. In FIG. 4 to FIG. 6, "+" denotes a state when the drive voltage is applied and "GND" denotes a state when the ground potential is maintained (state when no drive voltage is applied).

To start with, in a state when the drive voltage is not applied to any of the two individual electrodes 27, the two inclined sections 22 are not deformed. The contact section 21 between these two inclined sections 22 is at a position projecting upwardly over a position of an under surface of the paper P (see FIG. 3A), and when the paper P is conveyed, the contact section 21 cannot be switched to this state (in other words, when the paper P is transported, the voltage is applied assuredly to any one of the two individual electrodes 27 of each actuator). From this state, as shown in FIG. 4, when the drive voltage is applied to both of the individual electrodes 27, both of the inclined sections 22 are deformed so as to project inwardly, and the contact section 21 moves to a position where the contact section 21 does not make a contact with the paper (stand-by position). A point of intersection A of two chain lines denotes a position of a tip of the contact section 21 while at the stand-by position.

Moreover, as shown in FIG. 5, when the drive voltage is applied only to the individual electrode 27 on an upstream side in the transporting direction (left side in FIG. 5), only the inclined section 22 on the upstream side in the transporting direction is deformed so as to project inwardly. Therefore, the contact section 21 moves to a position at which the contact section 21 can make a contact with the paper P and which is positioned on the upstream side (left side) of the stand-by position in the transporting direction (transporting-preparation position). Furthermore, as shown in FIG. 6, when drive voltage is applied only to the individual electrode on a downstream side in the transporting direction (right side in FIG. 6), only the inclined section 22 on the downstream side in the transporting direction is deformed so as to project inwardly. Therefore, the contact section moves to a position at which the contact section can make a contact with the paper P (transporting-end position) and which is positioned on the downstream side of the stand-by position in the transporting direction (right side). The actuator 10 is structured such that the paper P which is in contact with the contact section 21 can be transported by a minute feed amount in the transporting direction by moving the contact section 21 in an order of stand-by position (FIG. 4)→transporting-preparation position (FIG. 5)→transporting-end position (FIG. 6)→stand-by position (FIG. 4). Since the contact section 21 is moved to the transporting-preparation position, after having been returned from the transporting-end position to the stand-by position at which the contact section 21 does not make a contact with the paper P. Therefore, when the contact section 21 is moved from the transporting-end position to the transporting-preparation position, the paper P and the contact section 21 do not make a contact and the paper P can be transported smoothly.

Attention should be paid to a displacement of the actuator 10, in particular, the contact section 21 shown in FIG. 3 to FIG. 6. It is apparent that by controlling the drive voltage to the individual electrodes 27, the contact section 21 can be displaced freely in X and Z directions shown in FIG. 3, and can also be controlled to rotate about Y axis. In other words, although the actuator 10 of the present invention is extremely small in size and has a simple structure, it is possible to control minute and complicated movement. Thus, when such actuator is used, an application of the actuator to various devices and a movable apparatus, as shown in embodiments which will be described later on, is possible, and the actuator is extremely useful in the fields such as micro robots and micro devices.

As shown in FIG. 3, notches 22a and 22b (low stiffness sections) are formed in a lower surface side of an edge of each of the inclined sections 22 on a side of the contact section 21, and in an upper surface side of an edge of each of the inclined sections 22 on a side of the base section 23, respectively. The stiffness of the bent thin plate 20 is lowered partially at the notches 22a and 22b. Therefore, between the inclined sections 22 and the contact section 21, and between the inclined sections 22 and the base sections 23, the bent thin plate 20 tends to easily be deformed by bending, and it is possible to displace the contact section 21 even with a low voltage, thus improving the driving efficiency of the actuator 10. These notches 22a and 22b can be formed easily in the plate member 24, which is made of metal which and which forms the bent thin plate 20 and the base sections 23, by a method such as etching (half etching).

Moreover, as described earlier, since the upper surface of the contact section 21 is roughened, when the contact section 21 is moved in the transporting direction with the contact section 21 being in contact with the paper P, the frictional force acting between the paper P and the contact section 21 is increased. Therefore, the paper P hardly slips on the contact section 21 and can be transported assuredly by the contact section 21.

As shown in FIG. 2 to FIG. 6, the guide member 11 is arranged horizontally above the plurality of actuators to face the actuators 10. The guide member 11 includes guide sections 11a each of which faces one of the contact sections 21 of the plurality of actuators 10, and each of which is projected towards one of the contact sections 21, so as to guide the paper P which is transported in the transporting direction by the contact section 21. Therefore, the paper P can be guided and transported while being pinched from both the upper and the lower side by the contact section 21 and the guide section 11a projecting towards the contact section 21. Thus, it is possible to transport the paper P stably in the transporting direction.

Figure 7:
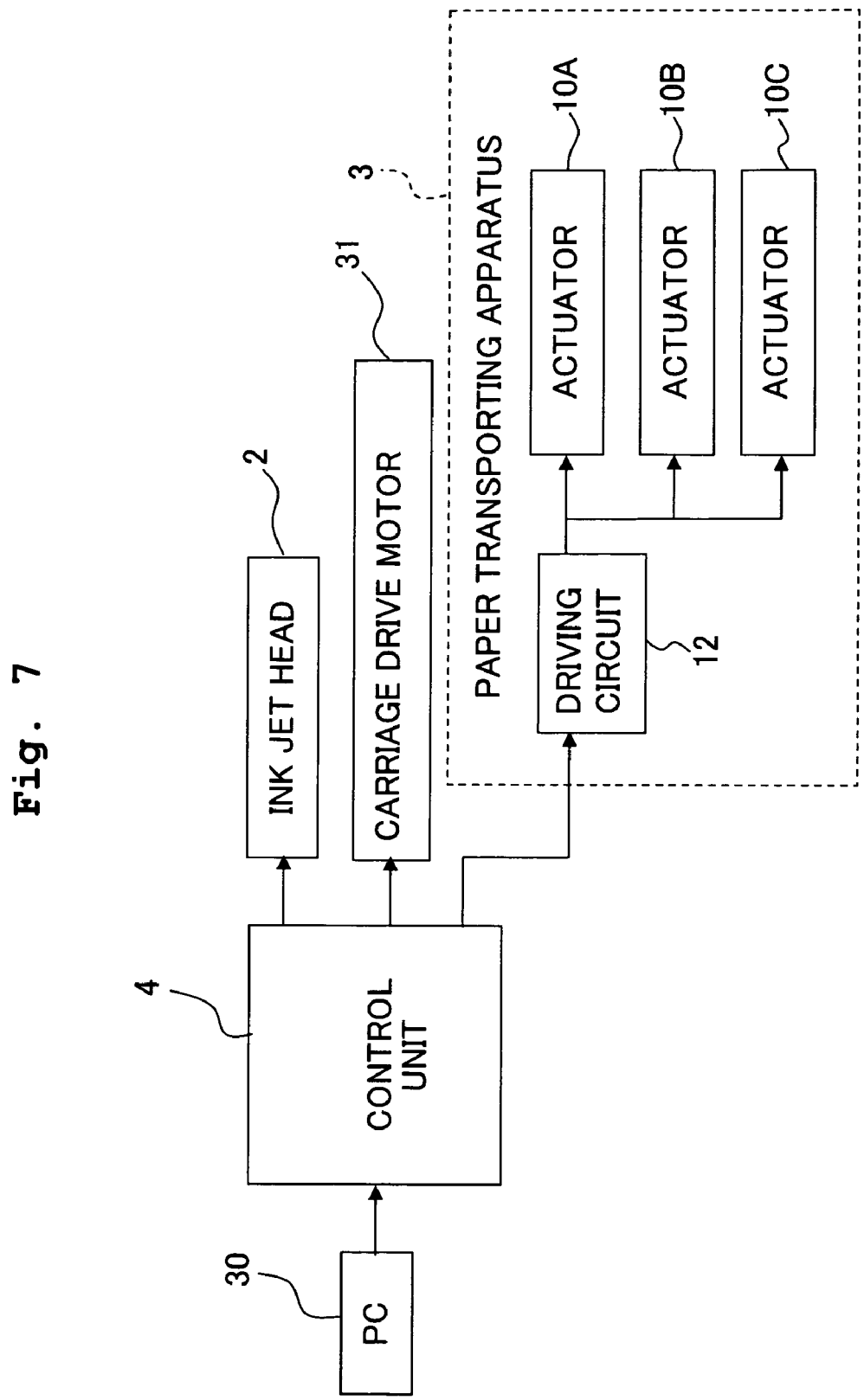
FIG. 7 is a block diagram showing an electrical structure of the ink-jet printer.

Next, the driving circuit 12 which supplies the drive signal to the plurality of actuators 10 will be explained. However, before explaining the driving circuit 12, an electrical structure of the ink-jet printer 100 will be explained briefly by referring to a block diagram in FIG. 7. As shown in FIG. 7, a signal of a print instruction and print data is input to a control unit 4 of the ink-jet printer 100 by an external personal computer (PC) 30. On the other hand, from the control unit 4, a control signal is output to a carriage drive motor 31 which reciprocates the carriage 1 in the scanning direction, and a control signal to discharge ink is output to the ink-jet head 2. Furthermore, from the control unit 4, a control signal to control the plurality of actuators 10 is also output to the driving circuit 12 of the paper transporting apparatus 3.

The driving circuit 12 applies a drive voltage to the individual electrodes 27 of the plurality of actuators 10 by supplying drive pulse signals S1 to S6 of a predetermined voltage $V_0$ as shown in FIG. 8A to FIG. 8F, respectively.

As shown in FIG. 9, the plurality of actuators 10 arranged in the scanning direction are divided into three groups of actuators 10A, 10B, and 10C. Three types of actuators 10a, 10b, and 10c belonging to the three groups of actuators 10A, 10B, and 10C, respectively, are arranged in the scanning direction in an order of actuator 10a, actuator 10b, and actuator 10c. The driving circuit 12 applies the drive voltage to the individual electrodes 27 of the three types of actuators 10 (10a to 10c) such that the three contact sections 21 of the three types of actuators 10a to 10c, belonging to the three groups of actuators 10A to 10C respectively, are positioned at any one of the stand-by position, the transporting-preparation position, and the transporting-end position, and the contact sections 21 of the respective actuators are at different positions from one another.

Figure 9A:
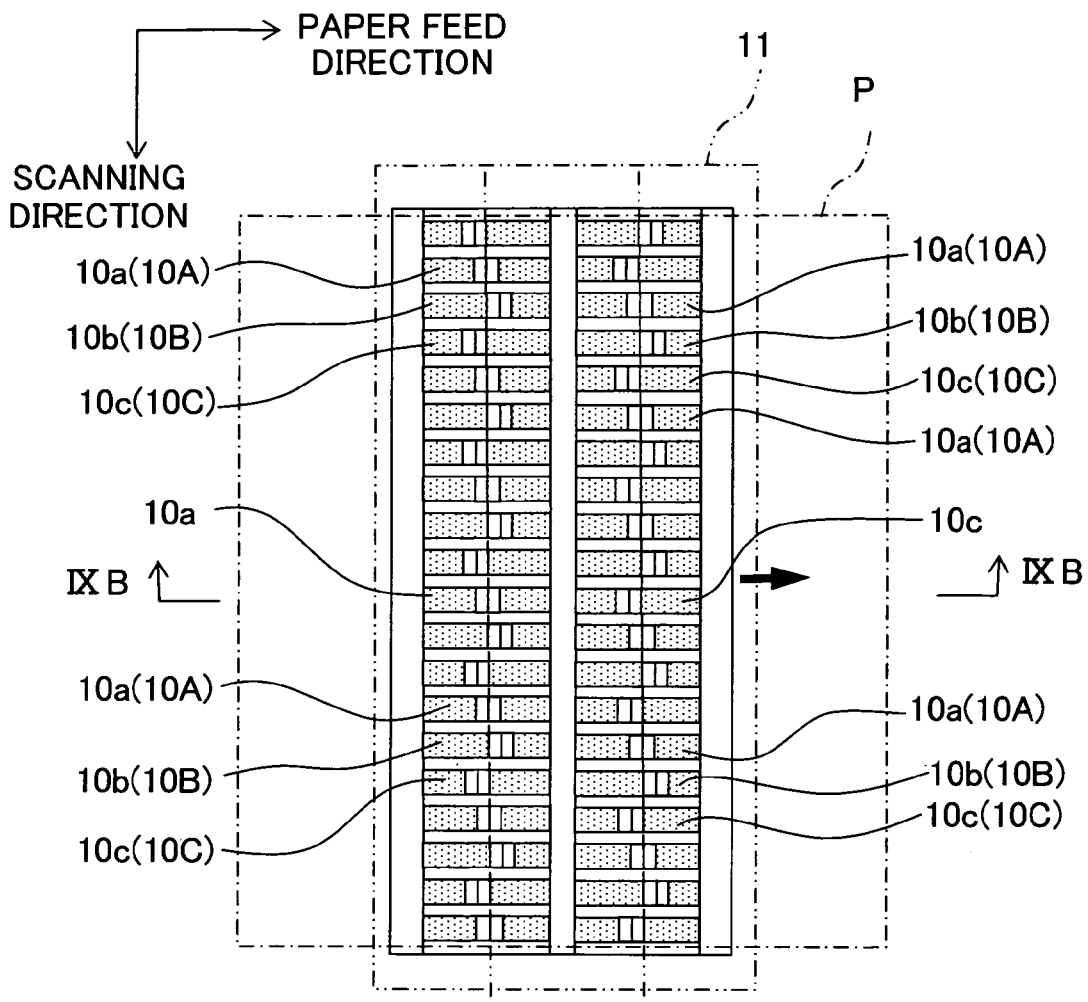
FIG. 9A is a plan view and FIG. 9B is a cross-sectional view taken along a line IXB-IXB.
Figure 9B:
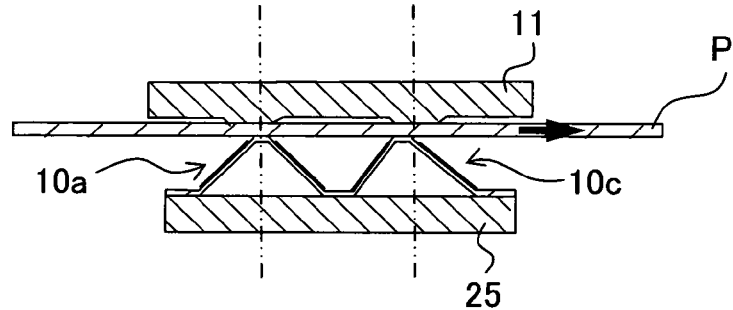

In other words, the driving circuit 12 supplies the drive pulse signal S1 in FIG. 8A to the individual electrode 27 on an upstream side (left side) in the transporting direction, of the actuator 10a belonging to the group of actuators 10A; and the driving circuit 12 supplies the drive pulse signal S2 in FIG. 8B to the individual electrode 27 on a downstream side (right side) in the transporting direction of the actuator 10a. Therefore, in time T1 in FIG. 8, for example, since the drive voltage is applied to both of the individual electrode 27 on the upstream side and the individual electrode 27 on the downstream side, the contact section 21 of this actuator 10a moves to the stand-by position as shown in FIGS. 9A and 9B.

Moreover, the driving circuit 12 supplies the drive pulse signal S3 in FIG. 8C to the individual electrode 27 on an upstream side in the transporting direction, of the actuator 10b belonging to the group of actuators 10B; and the driving circuit 12 supplies the drive pulse signal S4 in FIG. 8D to the individual electrode 27 on a downstream side in the transporting direction of the actuator 10b. In this case, the drive pulse signal S3 is delayed by a pulse width T0 than the drive pulse signal S1 (FIG. 8A) supplied to the individual electrode 27 on the upstream side of the actuator 10a, and the drive pulse signal S4 is delayed by the pulse width T0 than the drive pulse signal S2 (FIG. 8B) supplied to the individual electrode 27 on the downstream side of the actuator 10a. Therefore, for example, in time T1 in FIG. 8, since the drive voltage is not applied to the individual electrode 27 on the upstream side and the drive voltage is applied to the individual electrode 27 on the downstream side, only the inclined section 22 on the downstream side is deformed. Accordingly, as shown in FIGS. 9A and 9B, the contact section 21 of this actuator 10b moves to the transporting-end position which is positioned on the downstream side (right side) of the stand-by position in the transporting direction.

Moreover, the driving circuit 12 supplies the drive pulse signal S5 in FIG. 8E to the individual electrode 27 on an upstream side in the transporting direction, of the actuator 10c belonging to the group of actuator 10C; and the driving circuit 12 supplies the drive pulse signal S6 in FIG. 8F to the individual electrode 27 on the downstream side in the transporting direction of the actuator 10c. In this case, the drive pulse signal S5 is delayed by the pulse width T0 than the drive pulse signal S3 (FIG. 8C) supplied to the individual electrode 27 on the upstream side of the actuator 10b, and the drive pulse signal S6 is delayed by the pulse width T0 than the drive pulse signal S4 (FIG. 8D) supplied to the individual electrode 27 on the downstream side, of the actuator 10b. Therefore, for example, in time T1, since the drive voltage is applied to the individual electrode 27 on the upstream side and the drive voltage is not applied to the individual electrode 27 on the downstream side, the contact section 21 of this actuator 10c moves to the transporting-preparation position which is positioned on the upstream side (left side) of the stand-by position in the transporting direction.

Accordingly, the contact sections 21 of the three types of actuators 10a to 10c are at different positions from one another. Moreover, these all positions are switched at the same timing and the three types of actuators 10a to 10c carry out separately the transporting operation of the paper. Therefore, the transporting velocity is three times faster as compared to a transporting velocity when all the actuators 10 carry out the transporting operation with the same cycle. Furthermore, even if the contact sections 21 of a part of the actuators 10 are at the stand-by position at which the contact sections 21 do not make a contact with the paper P, the contact sections 21 of the other two types of actuators 10 are either at the transporting-preparation position or the transporting-end position, and the paper P is supported from the lower side by these contact sections 21. Therefore, the paper P can be transported smoothly without being shaken vertically. Moreover, these three types of actuators 10a to 10c are arranged in a predetermined order in the scanning direction and the same type of actuators 10 are arranged not to concentrate at a particular location. Therefore, it is possible to transport the paper P smoothly in the transporting direction. The driving circuit 12 described above corresponds to the voltage applying unit of the present invention which applies voltage to the individual electrodes 27.

Moreover, as shown in FIG. 9, the positions of the three types of actuators 10a to 10c between the two rows of actuators 10 are deviated by one position in the scanning direction. In other words, the actuators 10a in the row of the actuators on the upstream side (left side) in the transporting direction are adjacent to the actuators 10c in the row of the actuators on the downstream side in the transporting direction. Therefore, the positions of the contact sections 21 are always different between the two rows of the actuators 10.

A more specific example of the actuator 10 of the present embodiment will be described by way of an example. In FIG. 3, the bent thin plate 20 is made of stainless steel. Moreover, in a case that a distance L1 between two link sections connecting the inclined section 22 and the base section 23 is 10 mm, a length L of the inclined section 22 is 6.5 mm, a width B of the inclined section 22 is 3 mm, a thickness of the inclined section is 75 μm, and a thickness of the piezoelectric layer 26 is 20 μm, when a drive pulse signal in which voltage $V_0$ is 20 V and frequency is 20 kHz is supplied from the driving circuit 12 to the two individual electrodes 27, the contact section 21 is displaced by about 10 μm in the transporting direction and a feeding velocity is about 20 mm/s. Therefore, it is apparent that this actuator 10 can feed the paper P by a minute amount of about several tens of μm.

According to the paper transporting apparatus 3 described above, the following effects are achieved. By applying the voltage selectively to the two individual electrodes 27 by the driving circuit 12, the piezoelectric layer 26 (inclined section 22) can be deformed, and thus the contact section 21 can be moved in the order of stand-by position (FIG. 4)→transporting-preparation position (FIG. 5)→transporting-end position (FIG. 6)→stand-by position (FIG. 4). Therefore, it is possible to transport the paper P, which is in contact with the contact section 21, in the transporting direction by a minute feeding amount. Moreover, the contact section 21 is moved to the transporting-preparation position after having been returned to the stand-by position from the transporting-end position. Therefore, the paper P can be transported smoothly without making a contact with the contact section 21 while moving the contact section 21 from the transporting-end position to the transporting-preparation position.

The plurality of actuators 10 arranged in a row in the scanning direction is divided into three groups of actuators 10A to 10C. The three types of actuators 10a to 10c, belonging to the three groups of actuators 10A to 10C respectively, are at different positions from one another and separately carry out the transporting operation. Therefore, the transporting velocity is three times faster as compared to the transporting velocity when all the actuators 10 carry out the transporting operation at the same time. Furthermore, even when the contact sections 21 of a part of the actuators 10 are at the stand-by position at which the contact sections 21 do not make a contact with the paper P, the paper P is supported from the under side by the contact sections of the other actuators 10. Therefore, the paper P can be transported smoothly without being shaken vertically. Moreover, these three types of actuators 10a to 10c are arranged in a predetermined order in the scanning direction, and the same type of actuators 10 are arranged not to concentrate at a particular location. Therefore, a force acts evenly on the paper P and it is possible to transport the paper P smoothly.

Next, modified embodiments, in which various modifications are incorporated in the first embodiment described above, will be explained. Same reference numerals will be used for components which have a structure similar to a structure in the first embodiment described above and the description of these similar components will be omitted as deemed appropriate.

First Modified Embodiment

Figure 10A:
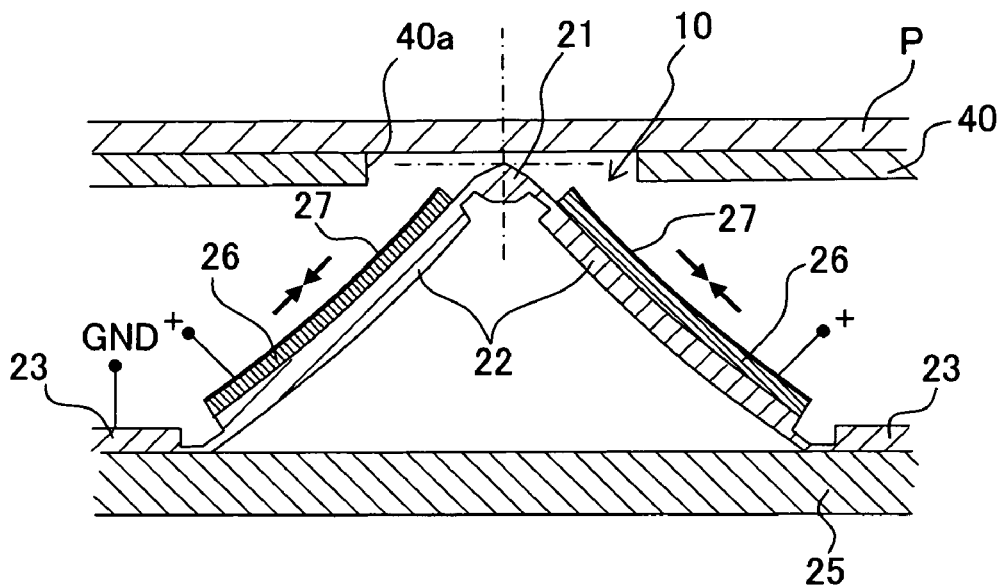
FIG. 10A is a cross-sectional view of an actuator of a first modified embodiment, showing the contact section at the stand-by position.
Figure 10B:
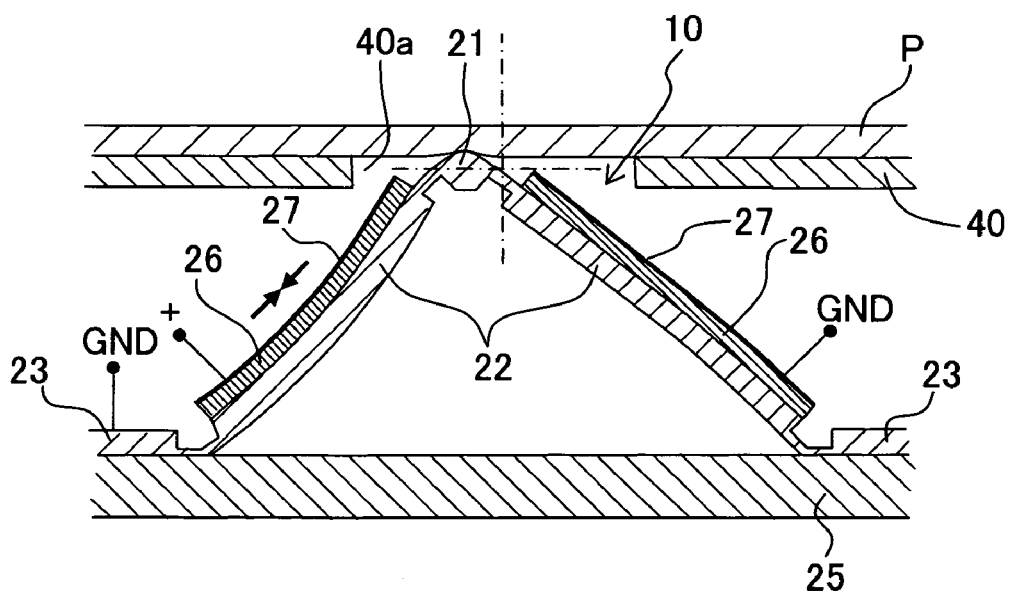
FIG. 10B shows the contact section at the transporting-preparation position.

In the first modified embodiment, as shown in FIG. 10, a supporting member 40 which is arranged over the plurality of actuators 10 to face the actuators 10 and which supports the paper P from the under side (a side of the contact section 21) is provided. A recess 40a is formed in a portion of the supporting member 40, the portion facing the contact section 21. The supporting member 40 supports the paper P in a portion other than the recess 40a, as shown in FIG. 10A, at a position which is away upwardly (direction of projection of the bent thin plate 20) from the contact section 21 which is at the stand-by position, and as shown in FIG. 10B, which is away downwardly (direction opposite to the direction of projection) from the contact section 21 which is at the transporting-preparation position (or the transporting-end position). Therefore, in particular, when the structure is such that the contact sections 21 of all the actuators 10 repeat the same operation (move with the same timing of the stand-by position→transporting-preparation position→transporting-end position→stand-by position), even when all of the contact sections 21 are moved to the stand-by position at which the contact sections 21 do not make a contact with the paper P, it is possible to transport the paper P stably in the transporting direction because the paper P is supported by the supporting member from the under side.

Second Modified Embodiment

Figure 11A:
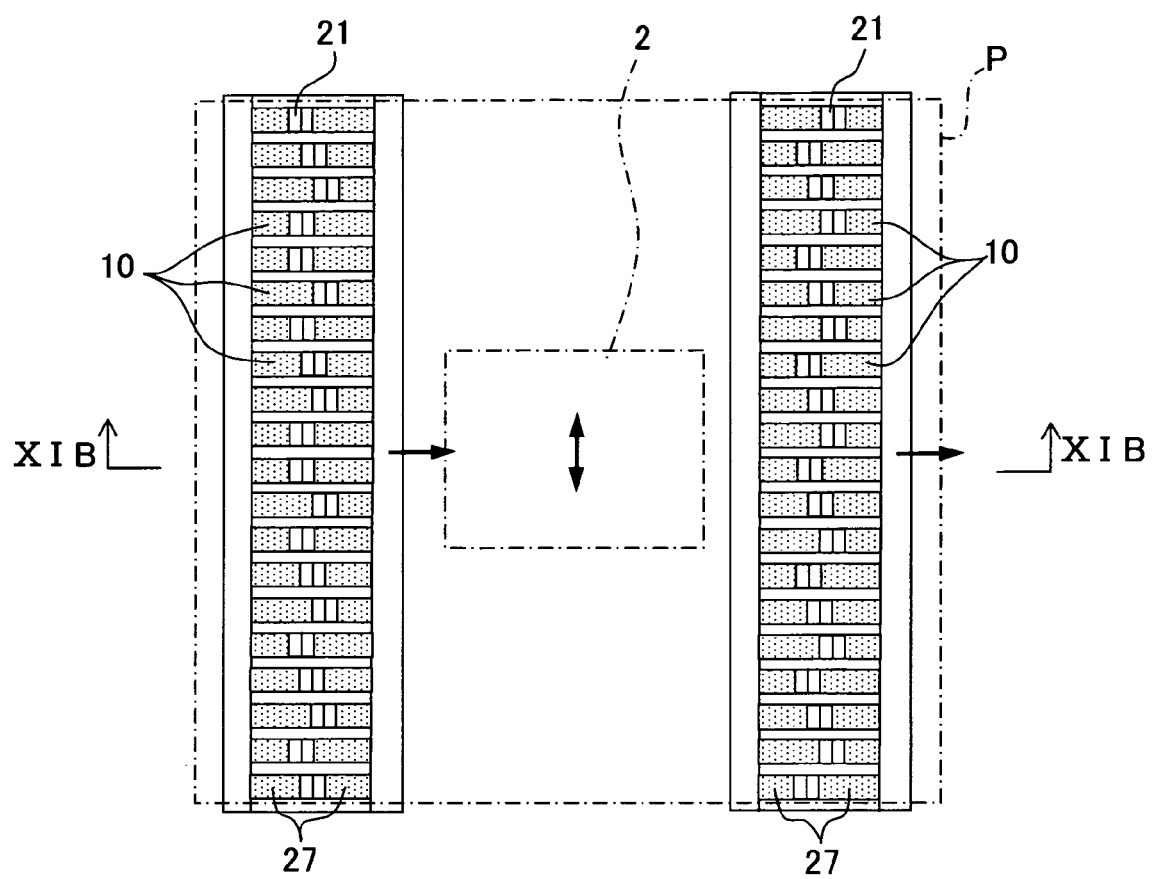
FIG. 11A is a plan view showing a plurality of actuators of a second modified embodiment and a third modified embodiment.
Figure 11B:
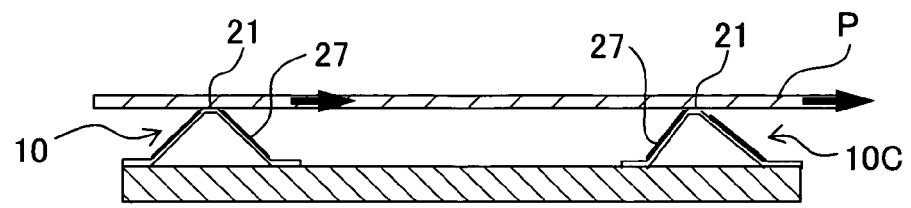
FIG. 11B is a cross-sectional view taken along a line XIB-XIB.
Figure 12A:
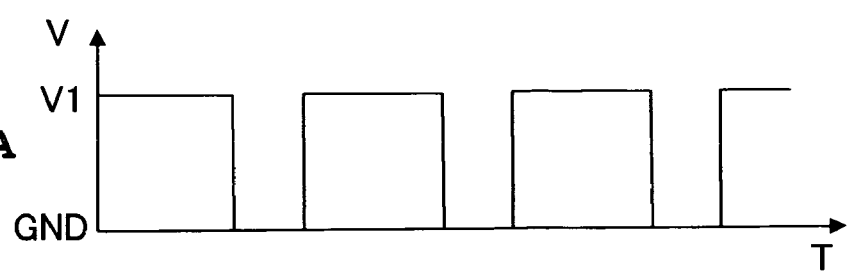
FIG. 12 (FIGS. 12A and 12B) is a waveform diagram of a drive pulse signal supplied to the actuator of the second modified embodiment.
Figure 12B:
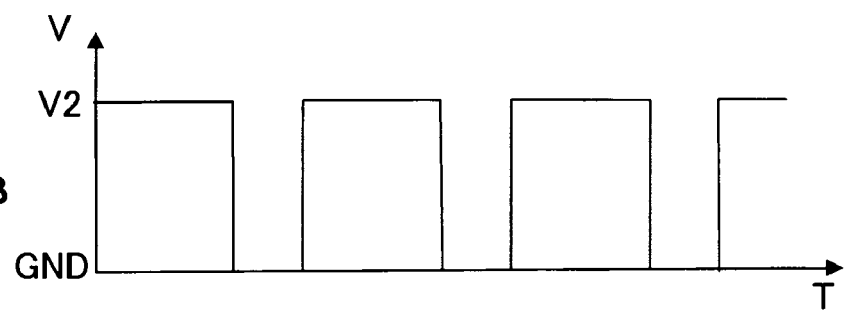

In the second modified embodiment, as shown in FIG. 11, the structure is such that, a drive pulse signal of voltage V1 as shown in FIG. 12A is supplied from the driving circuit 12 to the individual electrodes 27 of the plurality of actuators 10 arranged on an upstream side of the ink-jet head 2 in the transporting direction (left side in FIG. 1A), the ink-jet head 2 reciprocating in the scanning direction (vertical direction in FIG. 11A), and a pulse signal of voltage V2 (>V1) as shown in FIG. 12B is supplied to the individual electrodes 27 of the plurality of actuators 10 arranged on a downstream side of the ink-jet head 2 in the transporting direction (right side in FIG. 11A). As the voltage value of the drive pulse signal supplied to the actuator 10 is higher, the amount of deformation of the piezoelectric layer 26 becomes greater. Therefore, an amount of displacement of the contact section 21 when moving from the transporting-preparation position to the transporting-end position is increased. Further, since the drive pulse signal, having a voltage value higher than a voltage value of a drive pulse signal supplied to the individual electrodes 27 of the actuators 10 on the upstream side, is supplied to the individual electrodes 27 of the actuators 10 on the downstream side, a transporting velocity of the actuators 10 on the downstream side becomes higher than a transporting velocity of the actuators 10 on the upstream side, and a pulling force in the transporting direction acts on the paper P due to a difference in the transporting velocities. Therefore, the paper P, which tends to bend due to the ink having been discharged onto the paper P from the ink-jet head 2, can be stretched in the transporting direction, thereby preventing the bending of the paper.

Third Modified Embodiment

Figure 13A:
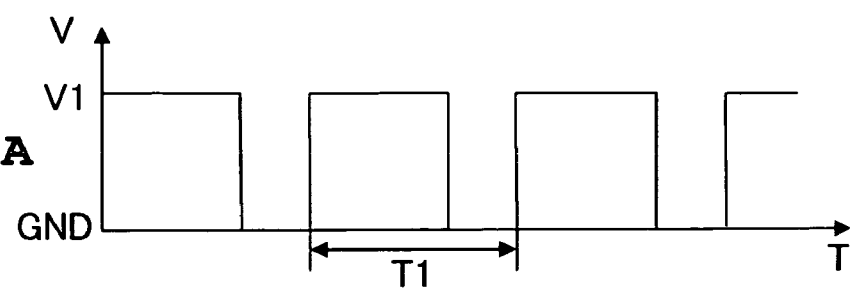
FIG. 13 (FIGS. 13A and 13B) is a waveform diagram of a drive pulse signal supplied to the actuator of the third modified embodiment.
Figure 13B:
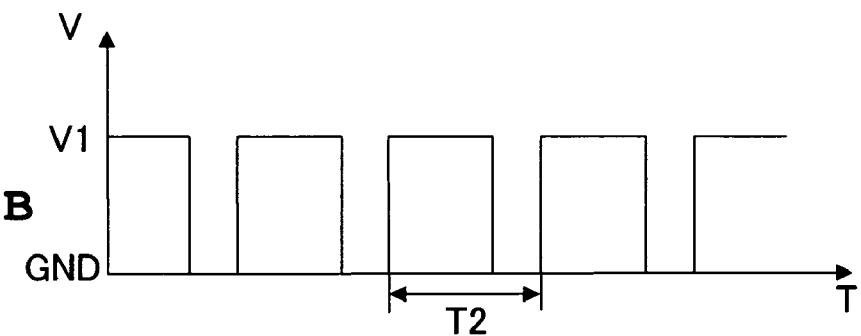

In lieu of the second modified embodiment, the structure may be such that a drive pulse signal of a period T1 as shown in FIG. 13A is supplied from the driving circuit 12 to the individual electrodes 27 of the plurality of actuators 10 arranged on the upstream side in the transporting direction (left side in FIG. 11A) and a drive pulse signal of a period T2 (<T1) as shown in FIG. 13B is supplied to the individual electrodes 27 of the plurality of actuators 10 arranged on the downstream side in the transporting direction (right side in FIG. 11). As the frequency of the drive pulse signal supplied to the actuators 10 is higher, a velocity at which the contact section 21 moves between the stand-by position, the transporting-preparation position, and the transporting-end position becomes greater. Therefore, similarly as in the second modified embodiment, the paper P can be stretched in the transporting direction, thereby preventing the bending of the paper P.

Fourth Modified Embodiment

Figure 14:
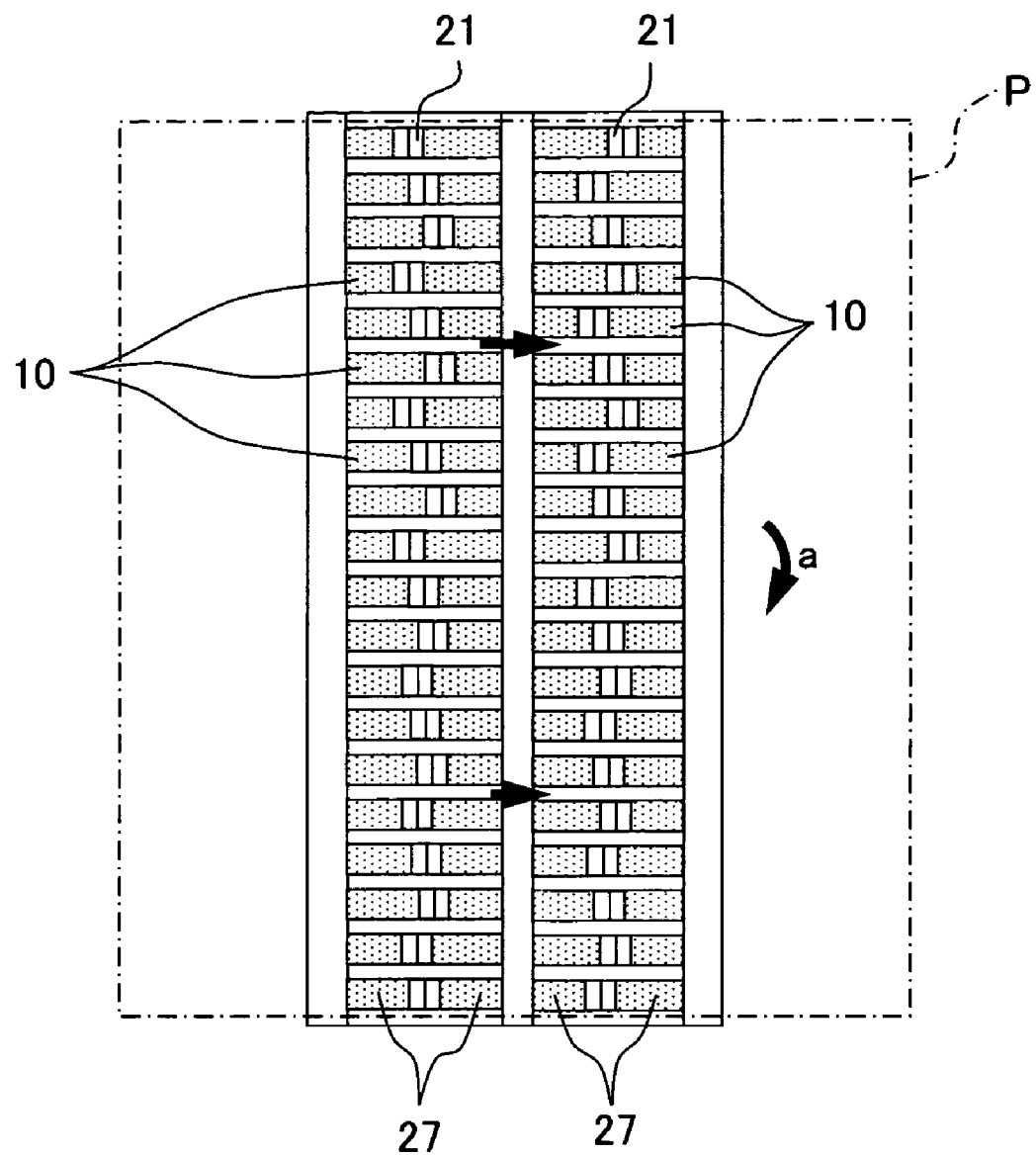
FIG. 14 is a plan view of a plurality of actuators of a fourth modified embodiment.

In the fourth modified embodiment, the structure is such that a drive pulse signal is supplied from the driving circuit 12 to a part of the actuators 10 which are arranged on one side of the scanning direction and are included in the plurality of actuators 10 arranged in the scanning direction, the drive pulse having a voltage value or a frequency higher than a voltage or a frequency of a drive pulse signal supplied to actuators 10 arranged on the other side of the scanning direction. For example, as shown in FIG. 14, when a drive pulse signal is supplied from the driving circuit 12 to the individual electrodes 27 of the actuators 10 in an upper half in FIG. 14, the drive pulse signal having a voltage value (for example, a drive pulse signal in FIG. 12B) or having a frequency (for example a drive pulse signal in FIG. 13B) higher than a voltage value or a frequency of a drive pulse signal supplied to the individual electrodes 27 of the actuators 10 in a lower half in FIG. 14, is supplied from the driving circuit 12 to the individual electrodes 27 of the actuators 10 in an upper half in FIG. 14, the transporting velocity of the actuators 10 in the upper half becomes greater than a transporting velocity of the actuators 10 in the lower half. Therefore, even when the paper P is inclined with respect to the transporting direction, due to a difference in the transporting velocity of the actuators 10 in the upper half and the transporting velocity of the actuators 10 in the lower half, it is possible to rotate the paper P in a direction of an arrow "a". In this case, the structure may be such that a sensor which detects as to whether the paper is inclined with respect to the transporting direction or not is further provided, and only when the paper P is detected to be inclined with respect to the transporting direction by the sensor, different drive pulse signals are supplied from the driving circuit 12 to the actuators 10 in the upper half and to the actuators 10 in the lower half.

Fifth Modified Embodiment

Figure 15:
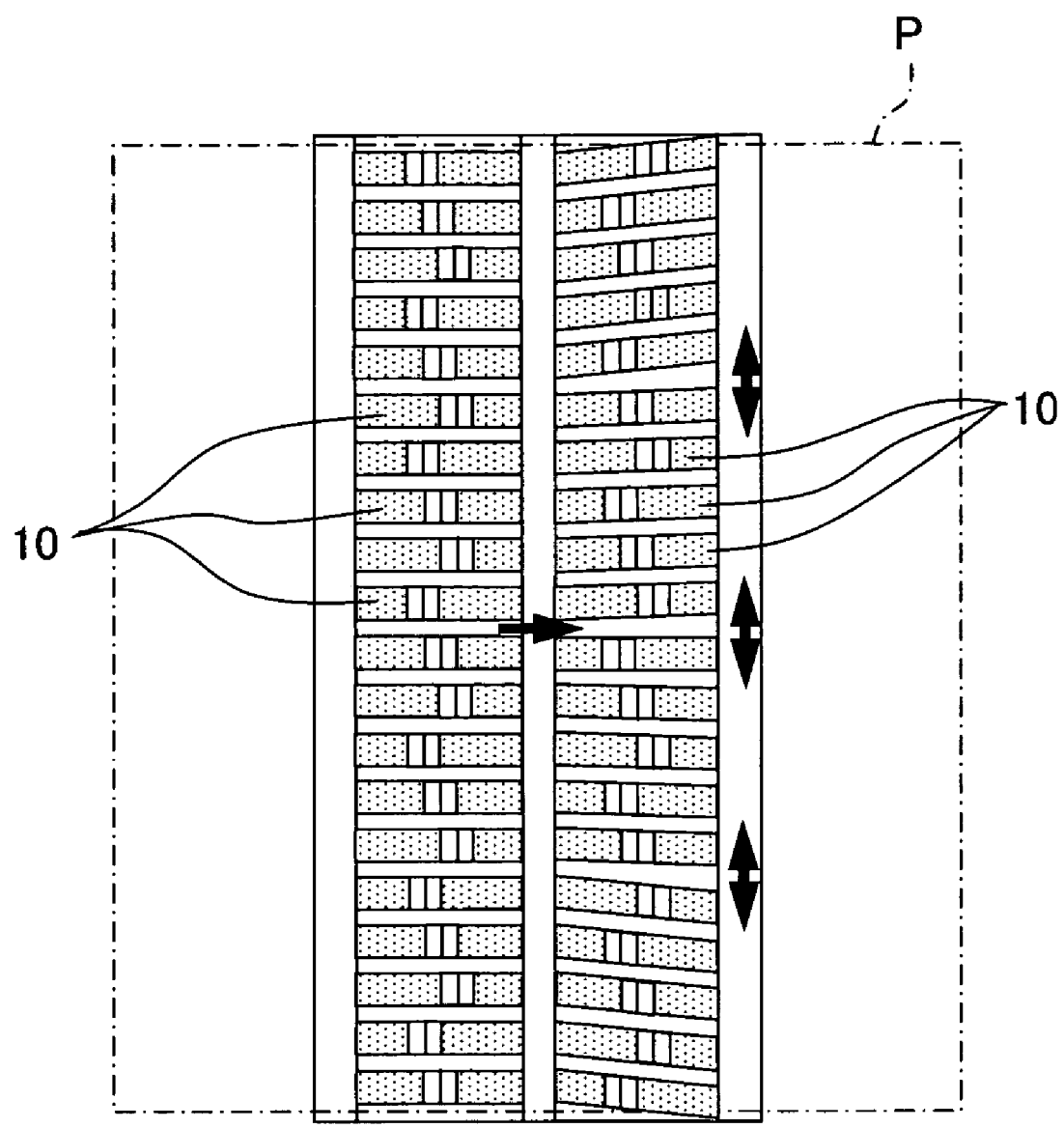
FIG. 15 is a plan view of a plurality of actuators of a fifth modified embodiment.

In the fifth modified embodiment, as shown in FIG. 15, a part of the plurality of actuators 10 arranged in the scanning direction is inclined at a predetermined angle with respect to the transporting direction so that a part of the actuators 10 is spread towards an outer side of a width direction of paper P (vertical direction in FIG. 15). In this case, while transporting the paper P in the transporting direction, since the pulling force acts on the paper P in the width direction thereof, the paper P, which tends to easily bend due to the ink having been discharged from the ink-jet head 2 onto the paper P, can be transported while being stretched in the width direction, and the bending of the paper P can be prevented. When the plurality of actuators 10 is arranged such that as the actuator 10 is positioned further towards an edge of the width direction, the actuator is more inclined with respect to the transporting direction, the pulling force in the width direction acting on the paper P is increased.

Sixth Modified Embodiment

Figure 16:
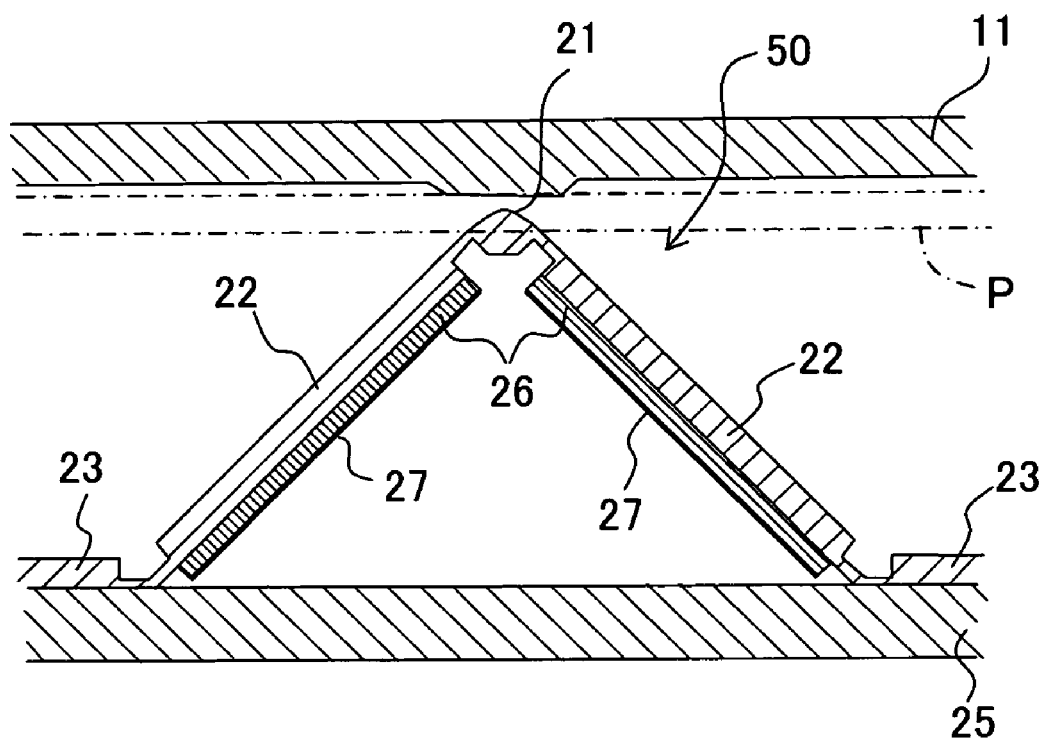
FIG. 16 is a cross-sectional view of an actuator of a sixth modified embodiment.

In the sixth modified embodiment, as shown in FIG. 16, in an actuator 50, the piezoelectric layers are provided to under surfaces (inner surfaces) of the inclined sections 22, and the individual electrodes 27 are further provided to under surfaces of the piezoelectric layers 26.

Seventh Modified Embodiment

Figure 17A:
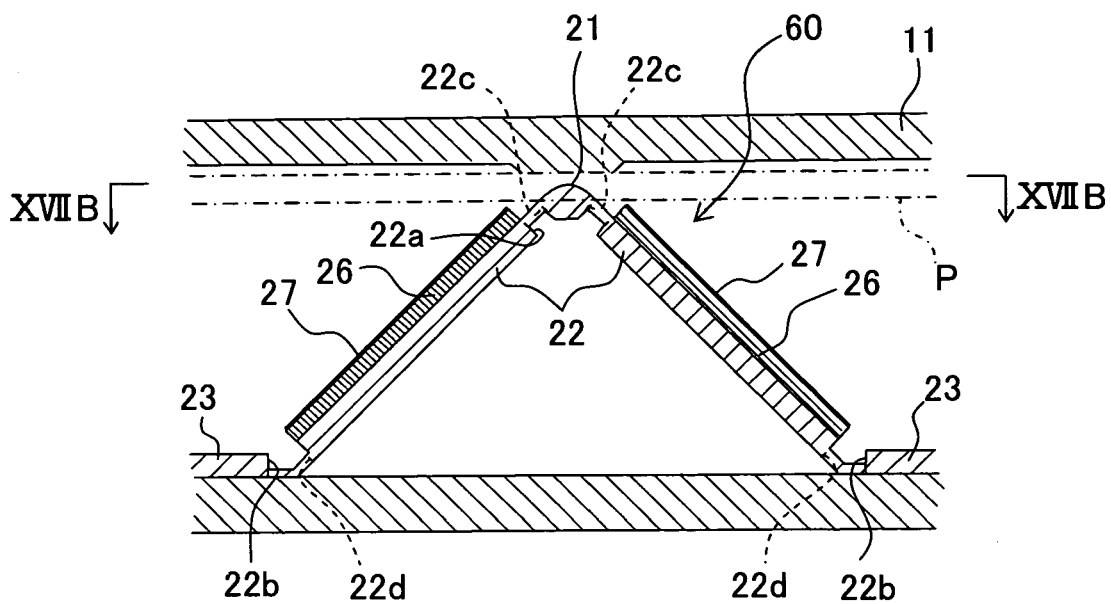
FIG. 17A is a cross-sectional view of an actuator of a seventh modified embodiment and FIG. 17B is a view taken along a line XVIIB-XVIIB in FIG. 17A.
Figure 17B:
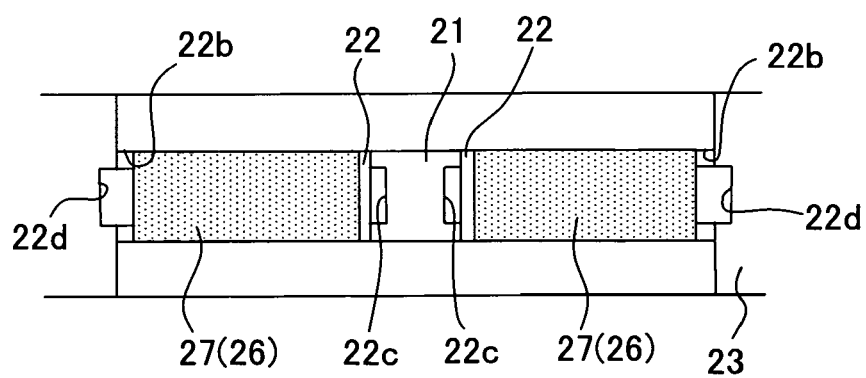

In the seventh modified embodiment, as shown in FIGS. 17A and 17B, in an actuator 60, through holes 22c and 22d are formed in a portion of an edge on the side of the contact section 21 and an edge on the side of the base section 23, respectively, of the inclined section 22 where the notches 22a and 22b are respectively formed, so as to further lower the stiffness of the bent thin plate. The through holes 22c and 22d, similar to the notches 22a and 22b, can also be formed with ease in the plate member made of a metal by a method such as etching (full etching).

Eighth Modified Embodiment

Figure 18:
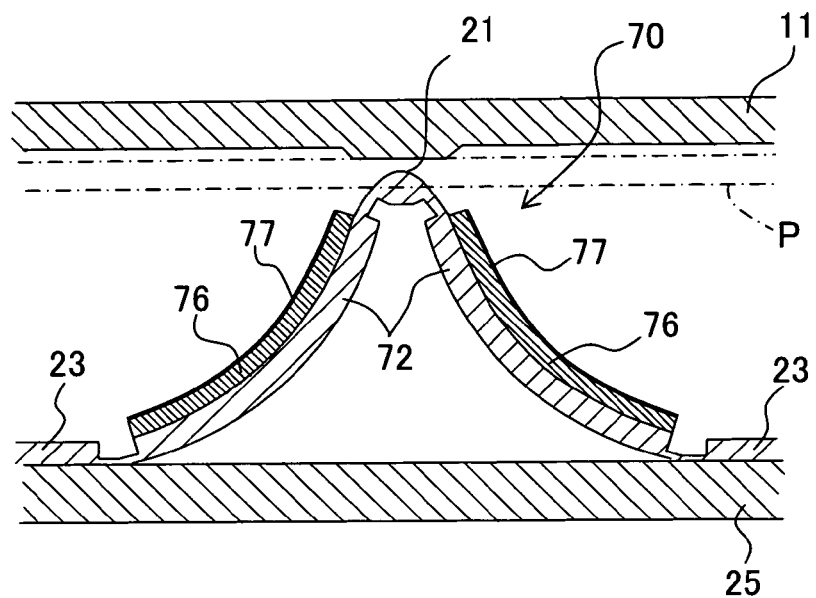
FIG. 18 is a cross-sectional view of an actuator of an eighth modified embodiment.

In the eighth modified embodiment, as shown in FIG. 18, in an actuator 80, two inclined sections 72 are curved inwardly with no voltage being applied to individual electrodes 77 from the driving circuit 12. In this case, the individual electrodes 77 and piezoelectric layers 76 provided to an upper surface side of the inclined section are also curved inwardly. Thus, in a case that the inclined sections 72 are curved inwardly, when the voltage is applied to the individual electrodes 77, the inclined sections further tend to bend. Therefore, the driving efficiency of the actuator 70 is improved.

Ninth Modified Embodiment

Figure 19:
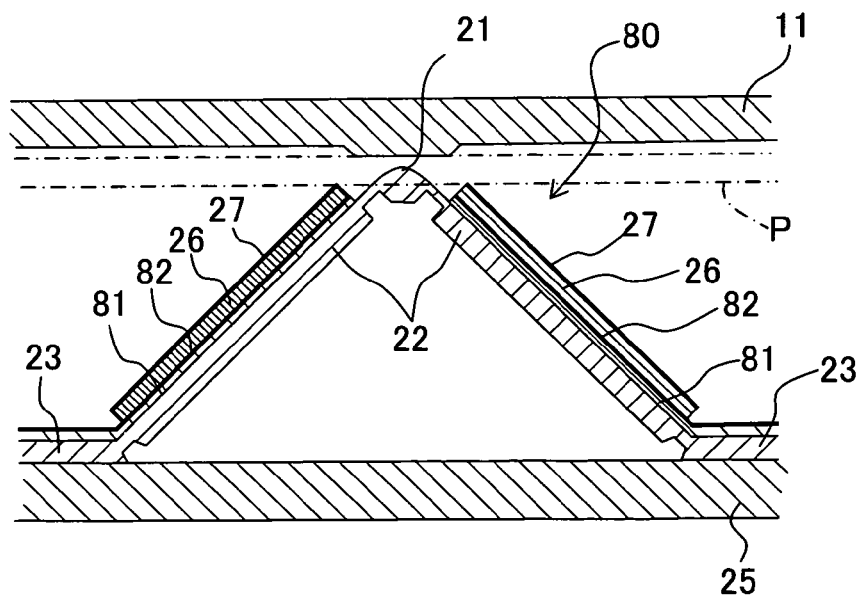
FIG. 19 is a cross-sectional view of an actuator of a ninth modified embodiment.

In the first embodiment described earlier, the piezoelectric layer 26 is sandwiched between the inclined section 22 and the individual electrode 27, and the inclined section 22 also serves as a common electrode which generates an electric field in the piezoelectric layer 26. However, in the ninth modified embodiment, the common electrode is provided separately from the inclined section. For example, as shown in FIG. 19, in an actuator 80, an insulating layer 81 formed of an insulating material may be formed in an upper surface of the inclined section 22 and the base section 23, and a common electrode 82 may be provided to an upper surface of the insulating layer 81. Or, although not specifically shown in the diagram, the individual electrodes 27 may be provided to the upper surface of the insulating layer 81 (under surface side of the piezoelectric layer) and the common electrode 82 may be provided to the upper surface of the piezoelectric layer 26.

Tenth Modified Embodiment

Figure 20:
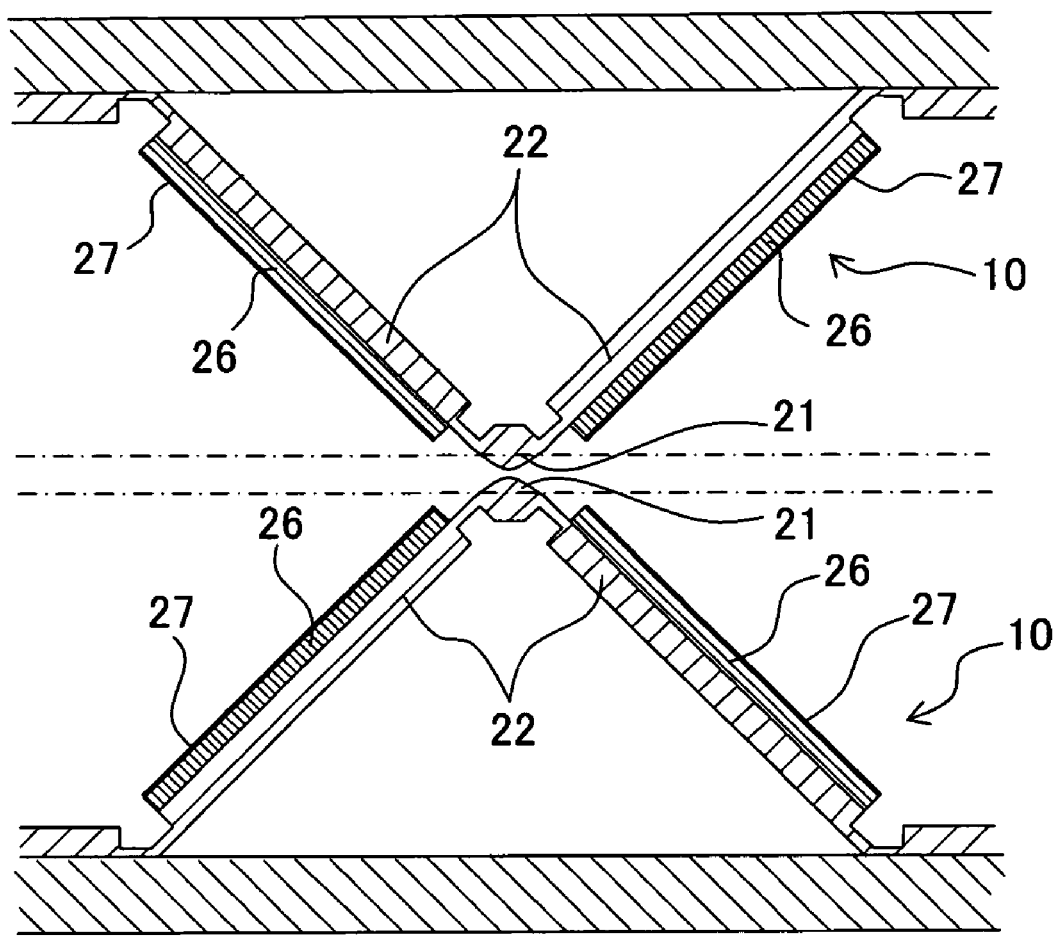
FIG. 20 is a cross-sectional view of two actuators of a tenth modified embodiment.

In the tenth modified embodiment, as shown in FIG. 20, the structure is such that two groups of the plurality of actuators 10 are arranged along a transporting plane of the paper P so as to pinch the paper P, and the paper is pinched between these two groups of actuators 10 and transported in the transporting direction. For example, when the paper absorbs moisture, the friction between the paper and a path of transportation is increased. However, even in such a case, the paper can be pinched between the two groups of upper and lower actuators 10 and can be transported assuredly in the transporting direction.

Eleventh Modified Embodiment

Figure 23A:
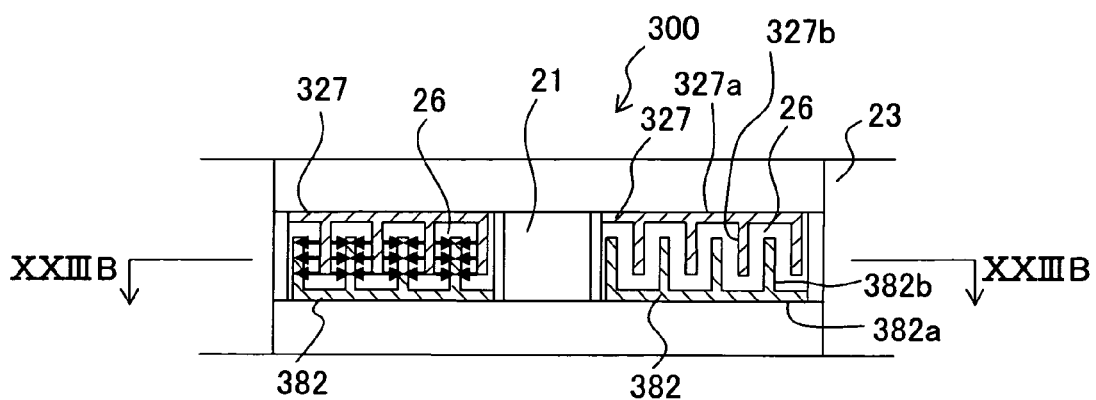
FIG. 23A is a cross-sectional view and FIG. 23B is a view taken along a line XXIIIB-XXIIIB in FIG. 3A.
Figure 23B:
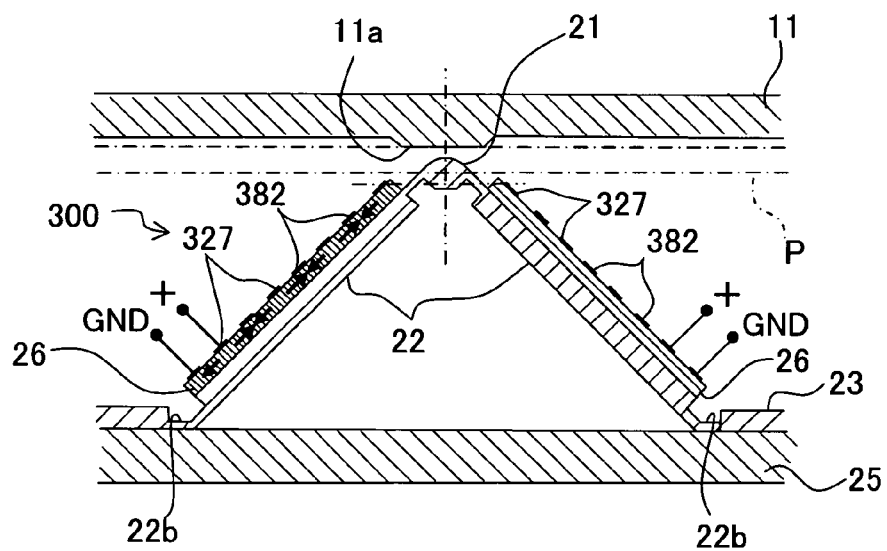

In the eleventh modified embodiment, as shown in FIG. 23A and FIG. 23B, an actuator 300 differs from the actuators in the first embodiment and the modified embodiments thereof described earlier in that both of an individual electrode (first electrode) 327 and a common electrode (second electrode) 382 are provided on a same surface of the piezoelectric layer 26. As shown in FIG. 23A, the individual electrode 327 and the common electrode 382 are formed to be separated mutually by a distance, and patterned and provided on the surface of the piezoelectric layer 26. The pattern of the individual electrode 327 includes a first side line 327*a* extending along a side in a longitudinal direction of the piezoelectric layer 26 and a plurality of first sub lines 327*b* extending from the first side line 327*a* in an orthogonal direction to the first side line 327*a*. The first sub lines 327*b* are separated mutually by a predetermined distance. The pattern of the common electrode 382 includes a second side line 382*a* extending along the side in the longitudinal direction of the piezoelectric layer 26 and facing the first side line 327*a*, and a plurality of second sub lines 382*b* extending from the second side lines 382*a* in an orthogonal direction to the second side line 382*a*. The second sub lines 382*b* are arranged such that the second sub lines 382*b* are separated mutually by a predetermined distance and also arranged alternately with the first sub lines 327*b*. A positive voltage is applied to the individual electrode 327 and the common electrode is at a ground potential.

When a voltage is applied to the individual electrode 327 patterned in such manner, an electric field is generated between the first sub lines 327*b* and the second sub lines 382*b*, and the piezoelectric layer 26 tends to contract in a direction shown by arrows in FIG. 23B. On the other hand, the inclined section 22 does not contract. Therefore, when a voltage is applied to the individual electrodes 327 of the piezoelectric layer 26 on an upstream side and a downstream side, the actuator 300 is deformed as shown in FIG. 4 and explained in the first embodiment; when a voltage is applied only to the individual electrode 327 of the piezoelectric layer 26 on the upstream side, the actuator 300 is deformed as shown in FIG. 5 and explained in the first embodiment; and when a voltage is applied only to the individual electrode 327 of the piezoelectric layer 26 on the downstream side, the actuator 300 is deformed as shown in FIG. 6 described and explained in the first embodiment. Due to such deformations being developed in succession, the actuator 300 can transport the paper P similarly as in the first embodiment.

The electrode pattern shown in FIG. 23A is only one example and a different pattern may be formed on the piezoelectric layer 26. Moreover, the eleventh modified embodiment may be combined with the structure and the drive voltage pattern in the modified embodiments described earlier.

The first embodiment and the first to the eleventh modified embodiments of the first embodiment are examples in which the present invention is applied to a paper transporting apparatus of a printer. However, the present invention can also be applied to paper transporting apparatuses of other image information equipment other than printer, such as a facsimile machine, a copier, or a scanner. Furthermore, the transporting apparatus of the present invention is not restricted to a transporting apparatus which carries an object in the form of a sheet such as paper, and the transporting apparatus can transport objects of different shapes such as a tubular shape, a plate shape, a box shape, or a cylindrical shape by contact sections of a plurality of the actuators. Therefore, the present invention can be applied to a transporting apparatus which is used for various applications.

Second Embodiment

Figure 21A:
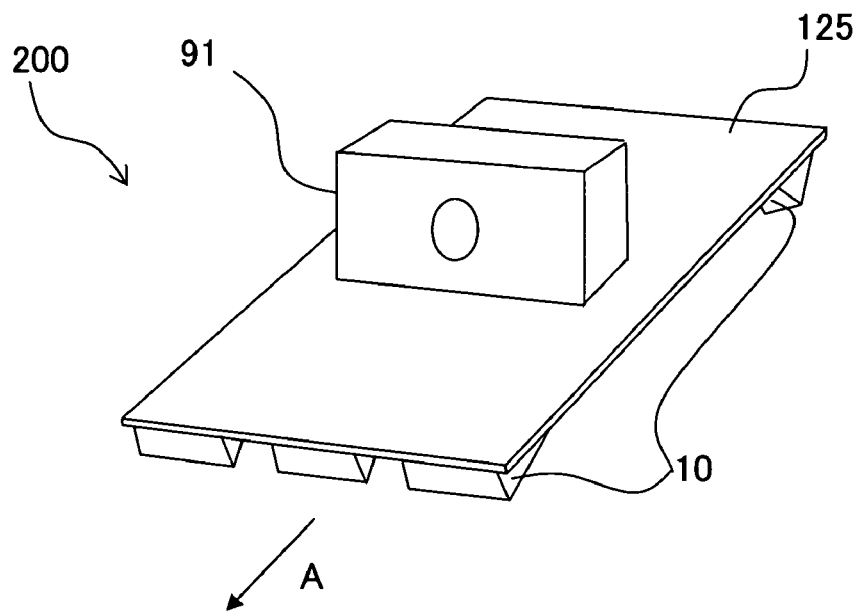
FIG. 21A is a schematic perspective view of a movable apparatus of the present invention.
Figure 21B:
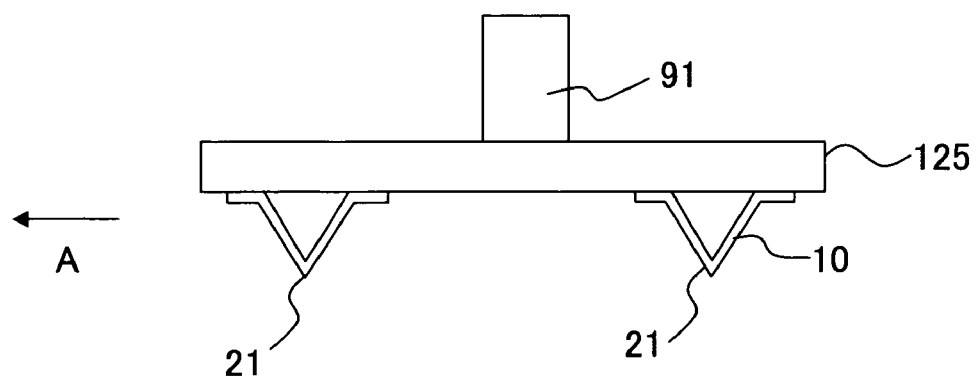
FIG. 21B is a side view of the movable apparatus shown in FIG. 21A.

A movable apparatus of the present invention will be explained by referring to FIG. 21A and FIG. 21B. A movable apparatus 100 includes a plurality of actuators 10 provided to a rear surface of a substrate 125. Mounting of the actuators 10 on the substrate 125 is similar to mounting of the actuators 10 used in the first embodiment. Hence the description of mounting is omitted (see FIG. 3). In the second embodiment, three of the actuators 10 are provided for each of rows in a front side and a rear side in a direction of advancement of the movable apparatus on the rear surface of the substrate 125. The contact section (apex section) 21 of the actuator 10 is arranged in downward direction and makes a contact with a floor surface. In other words, while the actuator 10 of the first embodiment interacts with the paper P and transports the paper P, the actuator 10 of the second embodiment interacts with an installation surface (floor surface) or an object surface, and the actuator 10 (and the substrate 25 on which the actuator is mounted) itself move on the installation surface or the object surface. An element 91 which has a charge coupled device (CCD) built-in is mounted on the substrate 125.

The three actuators 10 are driven by drive voltages in different timings (phases) as described in FIGS. 8 and 9 respectively, and the rows of actuator in the front and the rear are also driven by drive voltages in different timings (phases). By driving the actuators 10 in this manner, the movable apparatus can move freely on the installation surface or the object surface in a controlled direction and at a controlled velocity. For changing the direction of advancement, as described in the modified embodiment shown in FIG. 14, the drive voltages applied to the three actuators 10 in the same row may be made to be mutually different.

This movable apparatus 100 is suitable for an application of taking images in extremely narrow gaps, holes, in a tough environment of low temperature or high temperature, and in the space. In this example, the element 91 with the built-in charge coupled device (CCD) is mounted on the substrate 125. However, any object according to the application, such as a temperature sensor, a micro tool, a micro robot arm can be mounted on the substrate 125. Particularly, in the actuator 10 of the present invention, since the apex section (contact section) is supported by two inclined surfaces, even when a comparatively heavy object is mounted on the substrate 125, the object can be supported stably and transported.

Third Embodiment

Figure 22A:
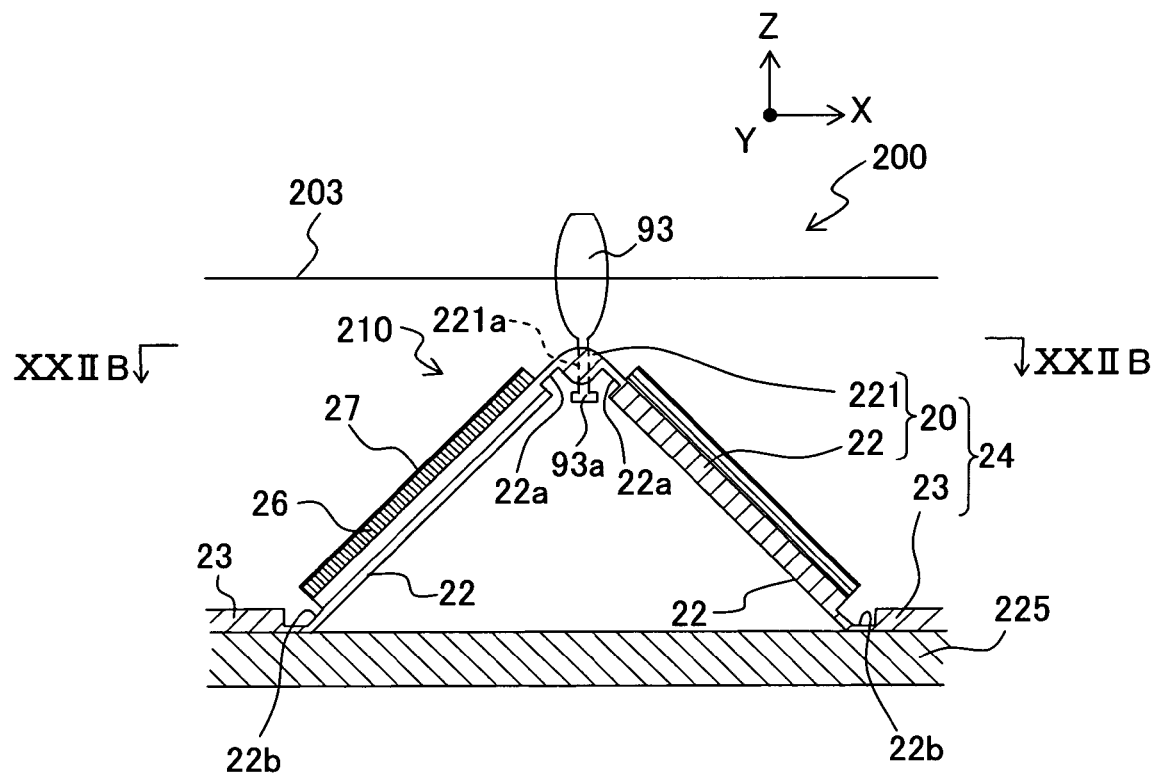
FIG. 22A is a schematic cross-sectional view of a device of the present invention and FIG. 22B is a view taken along a line XXIIB-XXIIB in FIG. 22A.
Figure 22B:
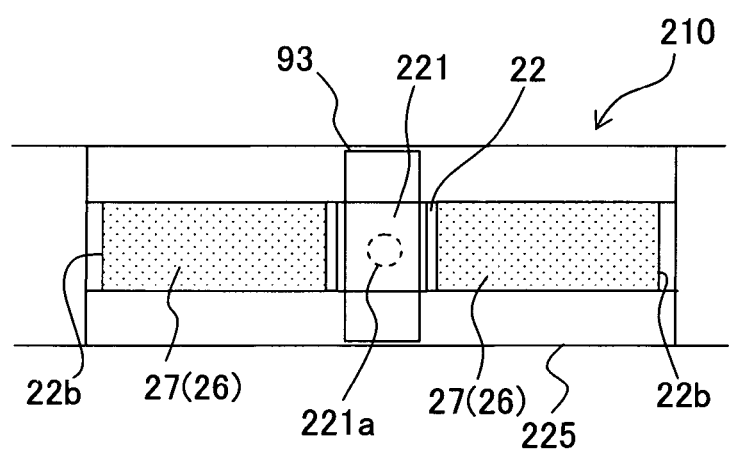

A device of the present invention will be described by referring to FIGS. 22A and 22B. A device 200 may include an actuator 210 provided in a surface of a substrate 225. A single actuator 210 may be installed on the substrate 225, and the substrate 225 may have a size sufficient to support the actuator. The substrate may be formed of any material such as plastic. Mounting of the actuator 210 and the substrate 225 is similar to the mounting of the actuators 10 used in the first embodiment. Hence the description of mounting is omitted (see FIG. 3). A lens 93 is mounted on an apex section 221 of the actuator 210. The lens 93 has a mounting section 93a on a lower end thereof and the mounting section 93a is inserted into a through hole 221a formed in the apex section 221 of the actuator 210. A drive voltage is applied to the actuator 210 from a driving circuit which is not shown in the diagram. By controlling a drive voltage applied to two inclined sections 26, the actuator is displaced as shown in FIG. 4 to FIG. 6. An amount of displacement can be adjusted by controlling the drive voltage. In this case, it should be noted that by driving the actuator 210, the element can be displaced freely in X and Z directions in the diagram, and rotational movement about Y axis is also possible. By carrying out this adjustment, a position at which light 203 emerged from the lens 93 is irradiated and a position at which the light 203 emerged from the lens 93 is focused can be controlled according to a direction in which the light 203 is incident in the lens 93.

An element to be mounted on the apex section 221 of the actuator 210 is not restricted to the lens 93, and any element such as an optical element like a prism and a mirror, various types of sensor elements, and imaging elements can be mounted. Moreover, in the third embodiment, a case in which there is a single actuator is illustrated. However, a plurality of actuators 210 may be arranged on a substrate 225 of a comparatively bigger size. In this case, each of the actuators can be made to function as a display apparatus by mounting a reflecting plate such as a mirror on each actuator 210.

In the third embodiment, a structure of a device in which an element is mounted on the apex section 221 of the actuator 210 is illustrated. However, the element may be mounted on the inclined section 22. For example, a reflecting plate can be provided on the individual electrode 27. Moreover, when a surface of the individual electrode 27 is mirror-finished, the individual electrode 27 functions as a reflecting element.

First Modified Example

Figure 24:
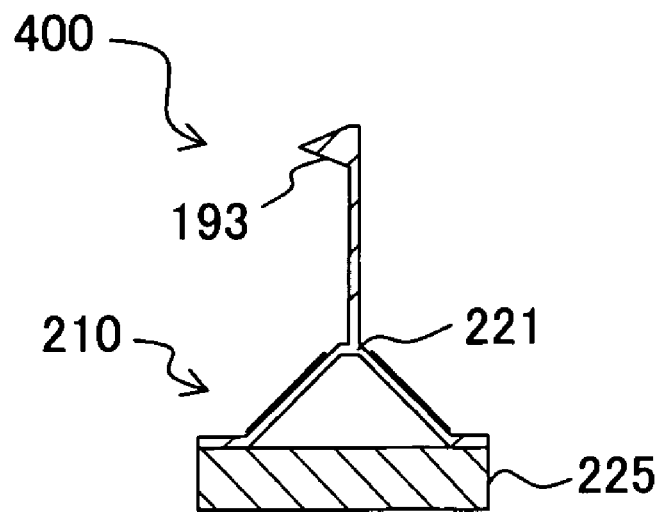
FIG. 24 is a diagram illustrating a probe device of a first modified example of the device of the present invention.

A first modified example of the device of the third embodiment is shown in FIG. 24. A device 400 shown in FIG. 24 is a probe with an actuator, which is used in an atomic force microscope (AFM). The device 400 differs from the third embodiment in that a probe 193 is provided instead of the lens 93 to the apex section 221 of the actuator 210. The rest of the components and the structure being the same as in the second embodiment, the description are omitted. In this device 400, since a position of the probe 193 can be changed freely by driving the actuator 210, it is possible to observe a desired position of a sample in the atomic force microscope.

Second Modified Example

Figure 25:
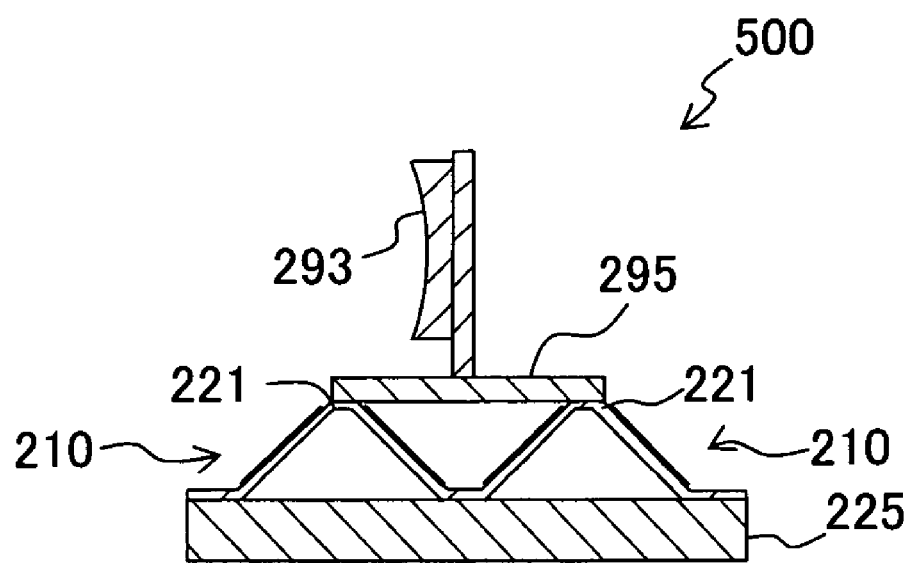
FIG. 25 is a diagram illustrating a mirror device of a second modified example of the device of the present invention.

A second modified example of the device of the third embodiment is shown in FIG. 25. A mirror device 500 shown in FIG. 25 is a reflecting mirror with an actuator. The device 500 includes a supporting base 295 which supports a mirror 293 on the apex sections 221 of the actuators 210. The rest of the components and the structure being the same as in the third embodiment, the explanation are omitted. The mirror device 500 can freely change a position of the mirror 293 by driving the actuators 210. The mirror 293 can be moved in a parallel direction by driving the two actuators 21 simultaneously in the same direction. Moreover, since an angle of the mirror 293 is variable, light which is incident obliquely on the mirror 293 can be allowed to be reflected in a desired direction. This mirror device 500 can also be used in a laser interferometer and a spectroscope.

Fourth Embodiment

Figure 26A:
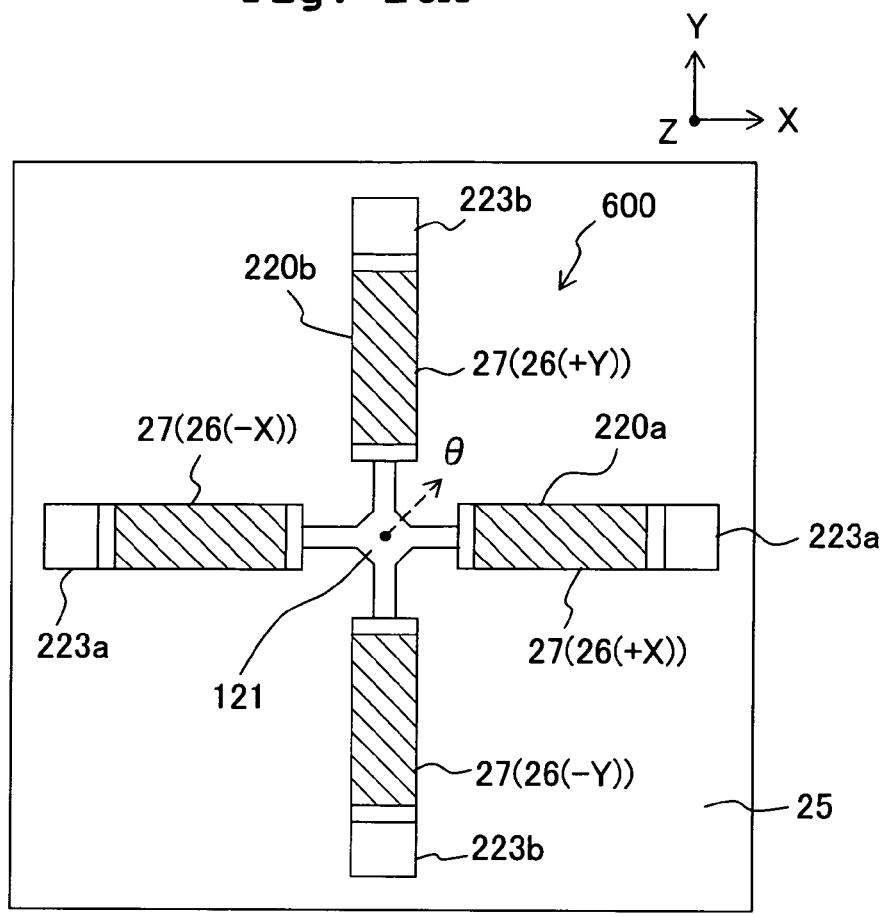
FIG. 26A is a plan view and FIG. 26B is a side view.
Figure 26B:
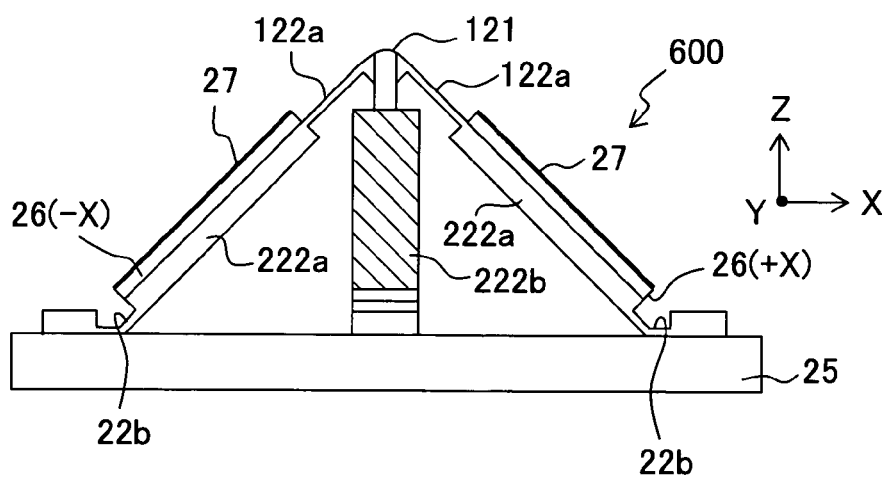

An actuator 600 according to a fourth embodiment shown in FIGS. 26A and 26B includes two bent thin plates 220a and 220b which are linked to intersect at an apex section 121. The bent thin plates 220a and 220b include inclined sections 222a and 222b (total four) respectively extending in a longitudinal direction from the apex section 121. Furthermore, base sections 223a and 223b (bases) extend horizontally from the inclined sections 222a and 222b, respectively, and these base sections 223a and 223b are fixed to a horizontal substrate 25. In other words, the thin bent plates 220a and 220b are bent at a central portion in the longitudinal direction, and the bent portion has a pyramid shape or a roof shape which is the apex section (contact section or object mounting section) 121. The inclined sections 222a and 222b are positioned on the substrate 25 inclined at a predetermined angle of inclination with respect to a surface of the substrate 25. In other words, the actuator 600 of the fourth embodiment differs from the actuator of the first embodiment in that a bent thin plate is further provided to the bent thin plate of the actuator of the first embodiment at the apex section, to be orthogonal to the bent thin plate of the actuator of the first embodiment. Since the rest of the materials and the structure being the same as the first embodiment, the explanations thereof are omitted.

The actuator 600 of the fourth embodiment includes two groups of piezoelectric layers 26(+X), 26(−X) and 26(+Y), and 26(−Y) extending in directions orthogonal to each other. Therefore, by controlling a voltage applied to these piezoelectric layers 26, and by applying voltage to any one of these piezoelectric layers 26, or to any more than one of these piezoelectric layers 26, or to all of these piezoelectric layers 26, an apex section 121 can be moved in any of X, Y, and Z directions based on a deformation of the piezoelectric layer 26 described in relation with to FIG. 4 to FIG. 6. In other words, in the actuator 600, a three-dimensional displacement is possible. For example, when a voltage is applied to the four piezoelectric layers 26(+X), 26(−X), 26(+Y), and 26(−Y), the piezoelectric layers 26(+X), 26(−X), 26(+Y), and 26(−Y) are contracted. Therefore, the apex section 121 moves in a −Z direction. Moreover, when a voltage is applied to two piezoelectric layers 26(+X) and 26(+Y), the apex section 121 moves in a θ direction in FIG. 26A. By controlling a piezoelectric layer or layers to which a voltage is applied and a value of voltage applied, a position of the apex section can be changed three-dimensionally. Therefore, the actuator 600 can be used as a transporting apparatus as in the first embodiment.

Various devices can be provided by mounting an optical element such as the lens and the mirror, and a testing element such as the probe mentioned earlier on the apex section 121 of the actuator 600 of the fourth embodiment. A structure and positions of fixing the individual electrode 27 and the common electrode of the actuator 600 are not restricted to the structure and positions described in the first embodiment, and the structure and positions shown in the modified embodiments described earlier may be used. In the actuator 600 of the fourth embodiment, two bent thin plates 220a and 220b orthogonal to each other at the apex section 121 are used. However, more than two bent thin plates intersecting at the apex section 121 may be used.

The present invention is not restricted to the embodiments and the modified embodiments disclosed above and various modifications within the scope of the claims of the present invention are possible. For example, the paper transporting apparatus 3 of the embodiment mentioned earlier is structured to transport the paper P along the horizontal transporting plane. However, the transporting plane is not restricted to a flat surface. For example, when the plurality of actuators 10 is arranged along a curved surface, the paper P can be transported along a curved transporting surface. Moreover, the bent thin plate is formed of a single plate member. However, a pair of plate members may be prepared and the thin plate may be formed by joining edges of the two plate members. In this case, the two plate members may become the inclined section and a joining portion of the two plate members may become the contact section (apex section). Moreover, in the transporting apparatus, the movable apparatus, and the device mentioned earlier, the actuator includes a base section which is connected to the inclined section. However, if it is possible that the actuator is supported or fixed on the substrate at an edge of the inclined section, the base section can be omitted (or the edge of the inclined section may be considered as the base section). For example, in FIG. 3, the notch 22b and the base section 23 may be removed and the edge of the inclined section may be fixed directly to the substrate 25 by bonding or welding, or a groove may be formed in the substrate, and the edge of the inclined section may be fitted into the groove.

Although the actuator of the present invention is small in size and has a simple structure, the apex section or the contact section of the actuator can be displaced freely in X and Z directions, and moreover, the rotational movement about the Y axis is also possible. The actuator of the present invention further can be displaced three-dimensionally. For this reason, the actuator of the present invention is extremely useful not only for control of drive of the transporting apparatus and the movable apparatus but also control of drive of a device with various elements mounted thereon, a micro tool such as a micro arm, and a micro robot. Such types of devices and micro arms play an active role in the medical field such as surgical operation, and in the field of space technology such as a satellite exploration.

What is claimed is:

1. An actuator comprising:
   a thin plate which is bent and which has an apex section and two substantially flat inclined sections extending from the apex section, a first end and a second end of the substantially flat inclined sections being attached to one or more bases, respectively;
   two piezoelectric layers which are arranged in the two inclined sections respectively; and
   two first electrodes which are provided to the two piezoelectric layers respectively and a second electrode which is provided to the two piezoelectric layers.

2. The actuator according to claim 1, wherein the two first electrodes are two individual electrodes each of which is provided to one surface of one of the two piezoelectric layers, and the second electrode is a common electrode which is provided to other surfaces of the two piezoelectric layers.

3. The actuator according to claim 2, further comprising a substrate to which the thin plate is attached via the bases.

4. The actuator according to claim 2, wherein the thin plate is bent in a direction orthogonal to a predetermined plane; the two inclined sections are extended from the apex section substantially in parallel to a transporting direction as viewed from the direction orthogonal to the predetermined plane; the apex section of the thin plate is a contact section which makes a contact with an object; and the bases are provided to edges of the two inclined sections respectively.

5. A transporting apparatus which transports an object in a transporting direction along a predetermined plane, the transporting apparatus comprising:
   a plurality of the actuators as defined in claim 4; and
   a voltage applying unit which selectively applies voltage to the two individual electrodes of each of the actuators.

6. The transporting apparatus according to claim 5, wherein the plurality of actuators is arranged on a same plane.

7. The transporting apparatus according to claim 5, wherein the thin plate and the bases are formed on one plate member.

8. The transporting apparatus according to claim 7, wherein the plate member is formed of a conductive material and the inclined sections functions as the common electrode.

9. The transporting apparatus according to claim 5, wherein when a voltage is applied to both of the individual electrodes by the voltage applying unit, the actuator moves to a stand-by position at which the contact section makes no contact with the object;
   when a voltage is applied only to one of the two individual electrodes by the voltage applying unit, the actuator moves to a transporting-preparation position which is positioned on an upstream side of the stand-by position in the transporting direction and at which the contact section is capable of making a contact with the object; and
   when a voltage is applied only to the other of the two individual electrodes by the voltage applying unit, the actuator moves to a transporting-end position which is positioned on a downstream side of the stand-by position in the transporting direction and at which the contact section is capable of making a contact with the object.

10. The transporting apparatus according to claim 9, comprising a supporting member which supports the object from a side of the contact section,
    wherein the supporting member supports the object at a position which is away from the contact section which is at the stand-by position in a direction of projection of the thin plate, and which is away from the contact section which is at the transporting-preparation position and the contact section which is at the transporting-end position in a direction opposite to the direction of projection.

11. The transporting apparatus according to claim 9, wherein the plurality of actuators is divided into three types of actuators;
    the voltage applying unit applies a voltage to the individual electrodes of the three types of actuators such that three contact sections of the three types of actuators are at one of the stand-by position, the transporting-preparation position, and the transporting-end position, and such that the three contact sections are at different positions from one another; and
    the three types of actuators are arranged in parallel to the predetermined plane and in a predetermined order in a direction orthogonal to the transporting direction.

12. The transporting apparatus according to claim 5, wherein the plurality of actuators is arranged at least in two rows in a direction orthogonal to the transporting direction and in parallel to the predetermined plane; and
    the voltage applying unit applies a voltage to individual electrodes of one the actuators which is positioned on a downstream side in the transporting direction, by supplying a drive pulse signal having a voltage or a frequency higher than a voltage or a frequency of a drive pulse signal supplied to individual electrodes of another actuator which is positioned on an upstream side in the transporting direction.

13. The transporting apparatus according to claim 5, wherein at least a part of the inclined sections of the plurality of actuators is inclined at a predetermined angle with respect to the transporting direction, towards an outer side in a width direction which is orthogonal to the transporting direction, as viewed from the direction orthogonal to the predetermined plane.

14. The transporting apparatus according to claim 5, wherein the plurality of actuators is arranged in parallel to the predetermined plane and in the direction orthogonal to the transporting direction; and the voltage applying unit applies a voltage to individual electrodes of a part of actuators which are included in the plurality of actuators and are positioned on one side of the orthogonal direction, by supplying a drive pulse signal having a voltage or a frequency higher than a voltage or a frequency of a pulse signal supplied to individual electrodes of actuators which are positioned on other side of the orthogonal direction.

15. The transporting apparatus according to claim 5, wherein when no voltage is applied to the two individual electrodes by the voltage applying unit, the two inclined sections of the thin plate are curved inwardly.

16. The transporting apparatus according to claim 5, wherein two groups of the plurality of actuators are arranged along two mutually parallel planes, and the object is pinched between the two groups of actuators and transported in the transporting direction.

17. The transporting apparatus according to claim 5, comprising a guide member which is arranged to face the plurality of actuators, wherein the guide member includes guide sections each of which faces one of the contact sections of the plurality of actuators and each of which projects towards one of the contact sections to guide the object.

18. The transporting apparatus according to claim 5, wherein the contact section of the thin plate is roughened.

19. The transporting apparatus according to claim 5, wherein low stiffness section are formed in an edge of each of the inclined sections on a side of the contact section and in an edge of each of the inclined sections on a side of the base, the low stiffness sections having a stiffness lower than a stiffness of a portion other than the edge of each of the inclined sections on the side of the contact section and the edge of each of the inclined sections on the side of the base.

20. The transporting apparatus according to claim 5, wherein the object is a paper and the transporting apparatus is a paper transporting apparatus of an image information equipment.

21. The actuator according to claim 1, wherein the first electrodes and the second electrode are formed in a same surface of the piezoelectric layers.

22. A transporting apparatus which transports an object in a transporting direction along a predetermined plane, the transporting apparatus comprising:

a plurality of the actuators as defined in claim 21; and a voltage applying unit which selectively applies voltage to the first electrodes of each of the actuators.

23. The actuator according to claim 1, further comprising two inclined sections which extend from the apex section orthogonal to the two inclined sections.

24. A movable apparatus which moves with respect to an object, comprising:

a plurality of the actuators as defined in claim 1;

a substrate which supports the thin plate of each of the actuators; and a voltage applying unit which applies a voltage selectively to the two individual electrodes of each of the actuators, wherein the apex section moves with respect to the object.

25. The movable apparatus according to claim 24, wherein the voltage applying unit applies voltages in different phase to at least two of the actuators so that behaviors of the at least two actuators are different from each other.

26. A device including an actuator, comprising:

the actuator as defined in claim 1;

an element which is provided to the apex section or at least one of the inclined sections of the actuator; and a voltage applying unit which applies a voltage selectively on the two individual electrodes of the actuator.

27. The device according to claim 26, wherein the element is a sensor or an optical element.

28. The actuator according to claim 1, wherein low stiffness section are formed in an edge of each of the inclined sections on a side of the contact section and in an edge of each of the inclined sections on a side of the base, the low stiffness sections having a stiffness lower than a stiffness of a portion other than the edge of each of the inclined sections on the side of the contact section and the edge of each of the inclined sections on the side of the base.

* * * * *